(12) United States Patent
Morohoshi

(10) Patent No.: US 7,095,481 B2
(45) Date of Patent: Aug. 22, 2006

(54) EXPOSURE METHOD AND APPARATUS

(75) Inventor: Hiroshi Morohoshi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 317 days.

(21) Appl. No.: 10/660,681

(22) Filed: Sep. 12, 2003

(65) Prior Publication Data
US 2004/0053148 A1    Mar. 18, 2004

(30) Foreign Application Priority Data
Sep. 17, 2002    (JP)    ............... 2002-270751

(51) Int. Cl.
*G03B 27/68* (2006.01)
*G03B 27/42* (2006.01)
*G03B 27/32* (2006.01)
*G03F 7/20* (2006.01)

(52) U.S. Cl. .................. 355/52; 355/53; 355/67; 355/77; 430/30

(58) Field of Classification Search .......... 355/52, 355/53, 67, 77; 430/22, 30, 311, 319, 320, 430/312
See application file for complete search history.

(56) References Cited

U.S. PATENT DOCUMENTS

| | | | |
|---|---|---|---|
| 5,760,879 A | 6/1998 | Shinonaga et al. ........... | 355/55 |
| 6,563,573 B1 | 5/2003 | Morohoshi et al. ......... | 356/124 |
| 6,787,789 B1 * | 9/2004 | Van Der Laan ............. | 250/548 |
| 6,809,797 B1 * | 10/2004 | Baselmans et al. ........... | 355/52 |
| 2002/0159040 A1 * | 10/2002 | Hamatani et al. ............. | 355/52 |
| 2003/0091913 A1 | 5/2003 | Shiode ........................ | 430/22 |

FOREIGN PATENT DOCUMENTS

WO    WO 00/31592    * 6/2000

* cited by examiner

*Primary Examiner*—Alan Mathews
(74) *Attorney, Agent, or Firm*—Fitzpatrick, Cella, Harper & Scinto

(57) ABSTRACT

An exposure method for projecting, through a projection optical system, a predetermined pattern formed on a mask onto an object to be exposed. The exposure method includes the steps of dividing an effective light source area for illuminating the mask into plural point light sources, calculating a Zernike sensitivity coefficient that represents a sensitivity of a change of image quality of the predetermined pattern to a change of a Zernike coefficient, when wave front aberration in the projection optical system is developed into a Zernike polynomial for all divided point light sources, determining an effective light source distribution based on a combination of Zernike sensitivity coefficient of all divided point light sources, and forming the effective light source distribution by intensity of each point light source.

8 Claims, 20 Drawing Sheets

EXPOSURE METHOD AND APPARATUS

BACKGROUND OF THE INVENTION

The present invention generally relates to exposure, and, more particularly, to an exposure method and apparatus for fabricating various types of devices such as semiconductor chips, such as ICs and LSIs, display devices, such as liquid crystal panels, a detection device, such as thin film magnetic heads, and image pickup devices, such as CCDs.

In manufacturing fine semiconductor devices such as a semiconductor memory and a logic circuit in photolithography technology, a reduction projection exposure apparatus has been conventionally employed, which uses a projection optical system to project a circuit pattern formed on a mask (reticle) onto a wafer, etc., to transfer the circuit pattern.

Recent demands for smaller and finer electronic apparatuses have increasingly called for fine processing to semiconductor devices mounted onto the electronic apparatuses. The critical dimension transferable by the projection exposure apparatus or resolution is inappropriate to a wavelength of light used for exposure, and inversely proportionate to the numerical aperture ("NA") of the projection optical system. Since the shorter the wavelength is and the higher the NA is, the better the resolution becomes, a wavelength of exposure light is made shorter and the NA of a projection optical system is made higher.

A development of fine processing to circuit patterns has also strictly required a projection optical system to project an image with good image quality. For example, a semiconductor device having a node of 130 nm requires a projected image to restrain a deviation of critical dimensions of a circuit pattern within 10 nm. The demanded image quality of a projected image is met by adjusting residual aberration in a projection optical system to be as small as possible. For this adjustment, some proposed methods optimize a design value and an approach for a projection optical system, improve precision for a fabrication step of the projection optical system, or develop residual aberration adjustment approach and structure, etc. However, a short wavelength of exposure light and a high NA of a projection optical system make it difficult to make the residual aberration small.

Accordingly, the unacceptable image quality degradation due to the residual aberration of a projection optical system has been prevented from affecting manufacture of semiconductor devices by mounting an aberration correction mechanism onto an exposure apparatus, or by adding a fine offset to the NA of a projection optical system and/or the NA of an illumination optical system (although the latter is often replaced with a ratio σ=(NA of the illumination optical system)/(NA of the projection optical system used in an exposure apparatus for semiconductor devices)).

The aberration correction mechanism mounted on the exposure apparatus is able to correct merely wave front aberration of a low order in the residual aberration of the projection optical system. A detailed description will be given of this reason. Wave optics describes an aberrational amount of a projection optical system with dispersed light wave phases in each point on a pupil surface. In other words, it may be defined as distortion of wave front (that is, the same surface with respect to a light wave phase) or wave front aberration. In general, a projection optical system has a circular pupil surface, and thus, the wave front aberration is expressed as Zernike polynomials in Equations 1 and 2 using polar coordinates (r, θ) in the pupil surface. It is general to express an aberration amount in a projection optical system using Zernike coefficients $C_i$ in the exposure apparatus for semiconductor devices:

$$\sum C_i * R_n^m(r) * \{\cos m\theta + \sin m\theta\} \quad (1)$$

$$R_n^m = \sum_{k=0}^{(n-m)/2} (-1)^k \frac{(n-k)! r^{n-2k}}{k!\left(\frac{n+m}{2}-k\right)!\left(\frac{n-m}{2}-k\right)!} \quad (2)$$

Aberration expressed by the Zernike coefficient in which integers n and m are small, or an order of a function with respect to which r is low is called low-order aberration. In the conventional aberration correction mechanism that minutely changes intervals between lenses in the projection optical system or a wavelength of exposure light for aberrational correction may correct the low-order aberration, leaving high-order aberration as residual aberration.

On the other hand, according to a method of adding a fine offset to the NA of a projection optical system and/or the NA of an illumination optical system so as to reduce the image quality degradation, the NA is the only variable parameter and cannot arrest the image quality degradation as required for each semiconductor-device circuit pattern.

It is conceivable to reduce a shape change by adding an offset size or an auxiliary pattern to a circuit pattern on a mask on the assumption of size and shape changes due to the residual aberration in a projected image. However, this requires an appropriate size offset and an auxiliary pattern shape to be determined for each exposure according to a residual aberration in a projection optical system and shape changes in a circuit pattern, making a mask design complex. In addition, additions of a size offset and an auxiliary pattern would increase the mask manufacture cost.

The residual aberration differs among exposure apparatuses. Thus, a mask used for a process that requires the strictest image quality for a circuit pattern may restrain the image quality degradation within a permissible range only in a fixed apparatus, although it spends a long time and requires a high cost for manufacturing the mask. As a consequence, an inefficient operation of an exposure apparatus lowers the productivity or throughput of the semiconductor devices.

BRIEF SUMMARY OF THE INVENTION

Accordingly, it is an exemplary object of the present invention to provide an exposure method and apparatus with good resolution, which may reduce the image quality degradation due to the residual aberration of the projection optical system, and form a desired pattern.

An exposure method, according to one aspect of the present invention for projection, through a projection optical system, a predetermined pattern formed on a mask onto an object to be exposed, includes the steps of calculating a Zernike sensitivity coefficient that represents sensitivity of a change of image quality of the predetermined pattern to a change of a Zernike coefficient, when wave front aberration in the projection optical system is developed into a Zernike polynomial in plural point light sources that divide an effective light source area for illuminating the mask, and determining an effective light source distribution based on the intensity of each point light source and the Zernike sensitivity coefficient.

The calculating may step may be repeated for a combination of all the plural point light sources and the Zernike coefficient. The determining step may determine the effective light source using a combination of the point light sources while changing the intensity of the point light source and maintaining the image quality of the predetermined pattern. The wave front aberration may include residual aberration in the projection optical system.

An exposure apparatus of according to another aspect of the present invention includes a projection optical system for projecting a predetermined pattern formed on a mask onto an object to be exposed, an illumination optical system for varying an effective light source distribution for illuminating the mask, and a controller for controlling the effective light source shape based on a Zernike sensitivity coefficient that represents the sensitivity of a change of image quality of the predetermined pattern to a change of a Zernike coefficient, when wave front aberration in the projection optical system is developed into a Zernike polynomial.

A database of still another aspect according to the present invention, suitable for an exposure method for projecting, through a projection optical system, a predetermined pattern formed on a mask onto an object to be exposed indicates a Zernike sensitivity coefficient that represents sensitivity of a change of image quality of the predetermined pattern to a change of a Zernike coefficient, when wave front aberration in the projection optical system is developed into a Zernike polynomial.

A database of still another aspect according to the present invention, suitable for an exposure method for projecting, through a projection optical system, a predetermined pattern formed on a mask onto an object to be exposed indicates a Zernike sensitivity coefficient that represents sensitivity of a change of image quality of the predetermined pattern to a change of a Zernike coefficient, when wave front aberration in the projection optical system is developed into a Zernike polynomial.

A program that enables a computer to execute the above exposure method for projecting, through a projection optical system, a predetermined pattern formed on a mask onto an object to be exposed, also constitutes one aspect according to the present invention.

A device fabrication method of another aspect of this invention includes the steps of exposing a plate by using the above exposure apparatus, and performing a predetermined process for the exposed object. Claims for a device fabrication method for performing operations similar to that of the above exposure apparatus cover devices as intermediate and final products. Such devices include semiconductor chips, such as LSIs and VLSIs, CCDs, LCDs, magnetic sensors, thin film magnetic heads, and the like.

Other objects and further features of the present invention will become readily apparent from the following description of the preferred embodiments with reference to the accompanying drawings.

DETAILED DESCRIPTION OF THE PREFERRED EMBODIMENTS

Figure 1:
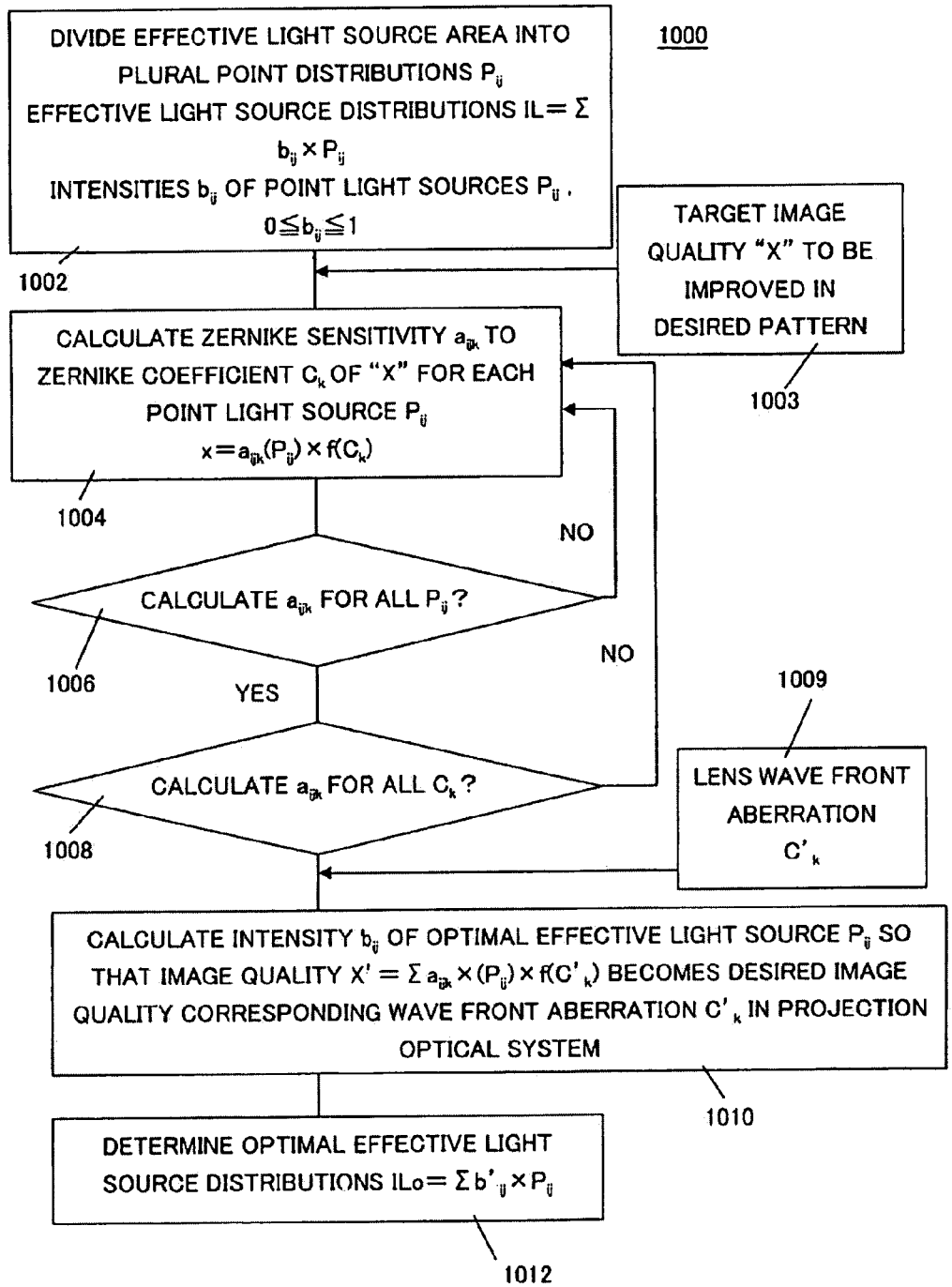
FIG. 1 is a flowchart for explaining an exposure method as one embodiment according to the present invention.

With reference to the accompanying drawings, a description will now be given of an exposure method and apparatus according to the present invention. In each figure, the same element is designated by the same reference numeral, and a description thereof will be omitted.

FIG. 1 is a flowchart for explaining an exposure method 1000 of one embodiment according to the present invention. The exposure method 1000 projects, through a projection optical system, a desired pattern formed on a mask onto an object to be exposed.

Referring now to FIG. 1, an effective light source area for illuminating the mask is divided into plural point light sources (step 1002). For example, the effective light source is divided like a lattice and expressed by a suffix of a row number i and a column number j, i.e., like a point light source $P_{ij}$ at a position having a row number i and a column number j. Equation 3 below represents an arbitrary effective light source distribution IL in the effective light source area where $b_{ij}$ is the intensity of each point light source $P_{ij}$, $0 \leq b_{ij} \leq 1$:

$$IL = \Sigma b_{ij} \times P_{ij} \quad (3)$$

A Zernike sensitivity coefficient to a Zernike coefficient $C_k$ for each point light source $P_{ij}$ is calculated using optical simulation with input information of a desired pattern formed on a mask and image quality to be improved in the desired pattern (steps 1003 and 1004). Here, the "Zernike sensitivity coefficient" represents sensitivity of a change of the image quality of the desired pattern to a change of the Zernike coefficient $C_k$. Equation 4, below, defines the Zernike sensitivity coefficients where x represents a change of the image quality, and $a_{ijk}$ is the Zernike sensitivity coefficients to the Zernike coefficient $C_k$ of the point light source $P_{ij}$:

$$x = a_{ijk}(P_{ij}) \times f(C_k) \quad (4)$$

It is determined whether the Zernike sensitivity coefficients $a_{ijk}$ have been calculated for all the point light sources $P_{ij}$ and, if not, step 1004 repeats to calculate the Zernike sensitivity coefficients $a_{ijk}$ for all the point light sources $P_{ij}$.

It is also determined whether the Zernike sensitivity coefficients $a_{ijk}$ have been calculated for all the Zernike coefficients $C_k$ (step 1008) and, if not, step 1004 repeats to calculate the Zernike sensitivity coefficients $a_{ijk}$ for all the Zernike coefficients $C_k$. After the steps 1004 to 1008, the Zernike sensitivity coefficients $a_{ijk}$ have been calculated for all the point light sources $P_{ij}$ and all the Zernike coefficients $C_k$.

Next, wave front aberration information concerning the projection optical system for which image quality is improved is input as a form of the Zernike coefficient, and image quality of the desired pattern in the projection optical system for an arbitrary effective light source distribution is calculated using the Zernike sensitivity coefficients $a_{ijk}$ calculated in the steps 1004 to 1008. Since an arbitrary effective light source shape is expressed by Equation 3 using the intensity $b_{ij}$ of each point light source $P_{ij}$, as discussed above, Equation 5 below expresses image quality x' of a desired pattern obtained from a combination of an arbitrary effective light source and a projection optical system having a wave front aberration $C'_k$:

$$x' = \Sigma a_{jk}(P_{ij}) \times b_{ij} \times f(C_k') \quad (5)$$

In other words, use of the Zernike sensitivity coefficients $a_{ijk}$ would easily calculate image quality to an arbitrary effective light source.

This may select the optimal one of image quality x' to an arbitrary effective light source calculated by Equation 5, or a combination of the intensity $b_{ij}$ of the optimal effective light source $P_{ij}$ for the desired image quality of the image quality x' (steps 1009 and 1010).

Equation 6 defines the optimal effective light source distribution Ilo in order to make the image quality of the desired pattern the desired image quality in a projection optical system having the wave front aberration $C_k$ (step 1012).

$$ILo = \Sigma b_{ij} \times P_{ij} \quad (6)$$

A mask is illuminated by the optimal effective light source distribution Ilo, and a desired pattern formed on a mask is exposed onto an object. The Zernike sensitivity coefficients calculated in the step 1012 may be stored as a database for all the effective light source positions.

The inventive exposure method 1000 may easily determine an optimal effective light source shape that may improve the projected image quality irrespective of an amount of wave front aberration of the projection optical system, e.g., residual aberration.

Thus, an illumination optical system that forms an arbitrary effective light source shape may form the optimal effective light source shape and illuminate the mask that forms a desired pattern. As a result, this may restrain a degradation of image quality of an image projected onto an object by a projection optical system, and obtain exposure with good resolution.

In addition, an arbitrary effective light source shape formed by the illumination optical system may prevent the image quality degradation due to the wave front aberration of the projection optical system, without adding a size offset or an auxiliary pattern to a desired pattern on the mask, reducing a mask design and mask manufacture cost.

A description will now be given of a concrete embodiment that uses a semiconductor exposure apparatus to determine an optimal effective light source shape distribution for use with the inventive exposure method 1000 with reference to FIGS. 2 to 13.

Figure 2:
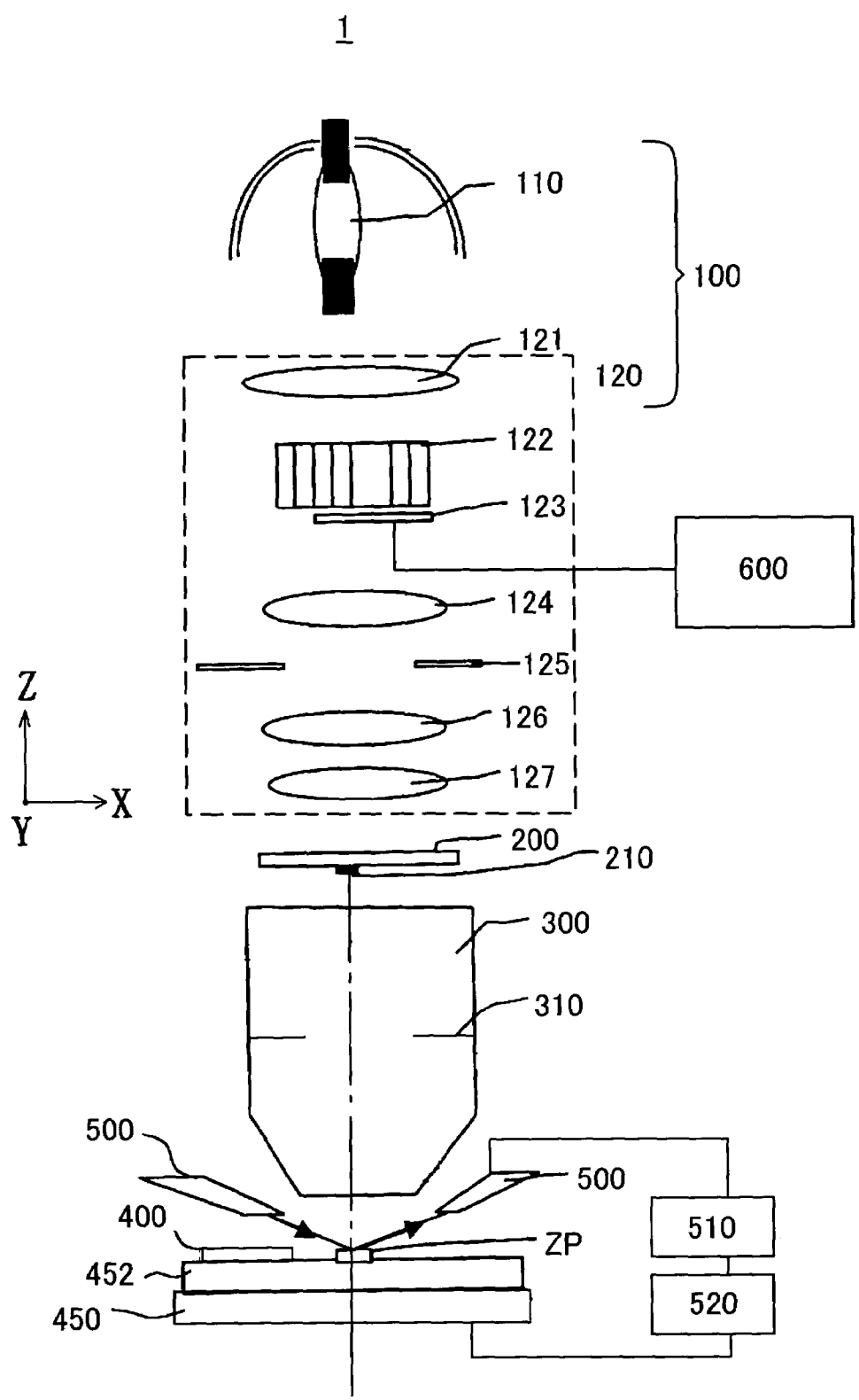
FIG. 2 is a schematic sectional view of an exposure apparatus as one aspect according to the present invention.

FIG. 2 is a schematic sectional view of the exposure apparatus 1 as one aspect according to the present invention. The exposure apparatus 1, a shown in FIG. 2, includes an illumination apparatus 100 for illuminating a mask 200 that forms a desired pattern 210, a projection optical system 300 that projects onto a plate 400, diffracted light generated from the illuminated desired pattern 210, a stage 450 that supports the plate 400, an autofocus system 500, and a controller 600.

The exposure apparatus 1 is a projection exposure apparatus that exposes the circuit pattern 210 created on the mask 200 in a step-and-scan or step-and-repeat manner onto the plate 400. Such an exposure apparatus is suitably applicable to a lithography process below the submicron or quarter-micron level, and a description will be given below of this embodiment taking a step-and-scan exposure apparatus (which is also called "a scanner") as an example. The step-and-scan manner, as used herein, is an exposure method that exposes a mask pattern onto a wafer by continuously scanning the wafer to the mask, and by moving, after a shot of exposure, the wafer stepwise to the next exposure area to be shot. The step-and-repeat manner is another mode of an exposure method that moves a wafer stepwise to an exposure area for the next shot for every shot of cell projection onto the wafer.

The illumination apparatus 100 illuminates the mask 200 that forms the circuit pattern 210 to be transferred, and includes a light source section 110 and an illumination optical system 120.

The light source section 110 uses, e.g., a laser as a light source. The laser to be used is an ArF excimer laser with a wavelength of about 193 nm, a KrF excimer laser with a wavelength of about 248 nm, an $F_2$ excimer laser with a wavelength of about 157 nm, etc. The kind of laser is not limited to the excimer laser. For example, a YAG laser can be used, and the number of laser units is not limited. A light source applicable to the light source section 110 is not limited to a laser, but may use one or more lamps such as a mercury lamp, a xenon lamp, etc.

The illumination optical system 120 is an optical system that illuminates the mask 200, and may vary an effective light source shape for illuminating the mask 200. The illumination optical system 120 includes an input lens 121, a fly-eye lens 122, an aperture stop 123, a first relay lens 124, a projection type reticle blind 125, a second relay lens 126, and a main condenser lens 127. The illumination optical system 120 uses the aperture stop 123 that may vary an aperture shape to form an arbitrary effective light source, but it may use a prism, for example, instead.

The illumination light IL emitted from the light source section 110 forms an arbitrary effective light source distribution just after the aperture stop 123 through the input lens 121 and fly-eye lens 122. The projection type reticle blind 125 limits an illumination area on the mask 200. The resultant light illuminates the mask 200 through the second relay lens 126 and main condenser lens 127.

The mask 200 is made, for example, of quartz, on which the circuit pattern (or an image) 210 to be transferred is created, and is supported and driven by a mask stage (not shown). The desired pattern 210 arranged on the mask 200 is illuminated by the illumination light IL, and projected, through the projection optical system 300, onto the plate 400 mounted on the wafer stage 450. The mask 200 and the plate 400 are located in an optically conjugate relationship. Since the exposure apparatus 1 according to this embodiment is a scanner, it transfers the pattern 210 on the mask 200 onto the plate 400 by scanning the mask 200 and plate 400 at a rate of a reduction magnification. If the exposure apparatus 1 is a step-and-repeat exposure apparatus (also referred to as a "stepper"), it exposes, while maintaining the mask 20 and plate 40, stationary.

This projection optical system 300 may use an optical system solely including a plurality of lens elements, an optical system, including a plurality of lens elements and at least one concave mirror (a catadioptric optical system), an optical system, including a plurality of lens elements and at least one diffractive optical element such as a kinoform, and a full mirror type optical system, and so on. Any necessary correction of the chromatic aberration may use a plurality of lens units made from glass materials having different dispersion values (Abbe values), or arrange a diffractive optical element such that it disperses in a direction opposite to that of the lens unit.

The plate 400 is absorbed and held on a wafer holder 452 on a wafer stage 450. A drive mechanism 520, which has been controlled by a control circuit 510 based on a detection result of the autofocus system 500, accords a surface of the plate 400 with an imaging surface ZP of the projection optical system 300. The plate 400 may move in a direction X or Y, and transfer a projected image of the desired pattern 210 on the mask 200 onto the plate 400 at an arbitrary position.

The controller 600 controls a distribution shape of the effective light source based on a Zernike sensitivity coefficient that represents sensitivity of a change of image quality of the desired pattern 210 to a change of a Zernike coefficient, when wave front aberration in the projection optical system 300 is developed into a Zernike polynomial. In other words, the controller 600 controls an aperture shape of the aperture stop 123 in the illumination optical system 120, and forms the optimal effective light source distribution.

Figure 3:
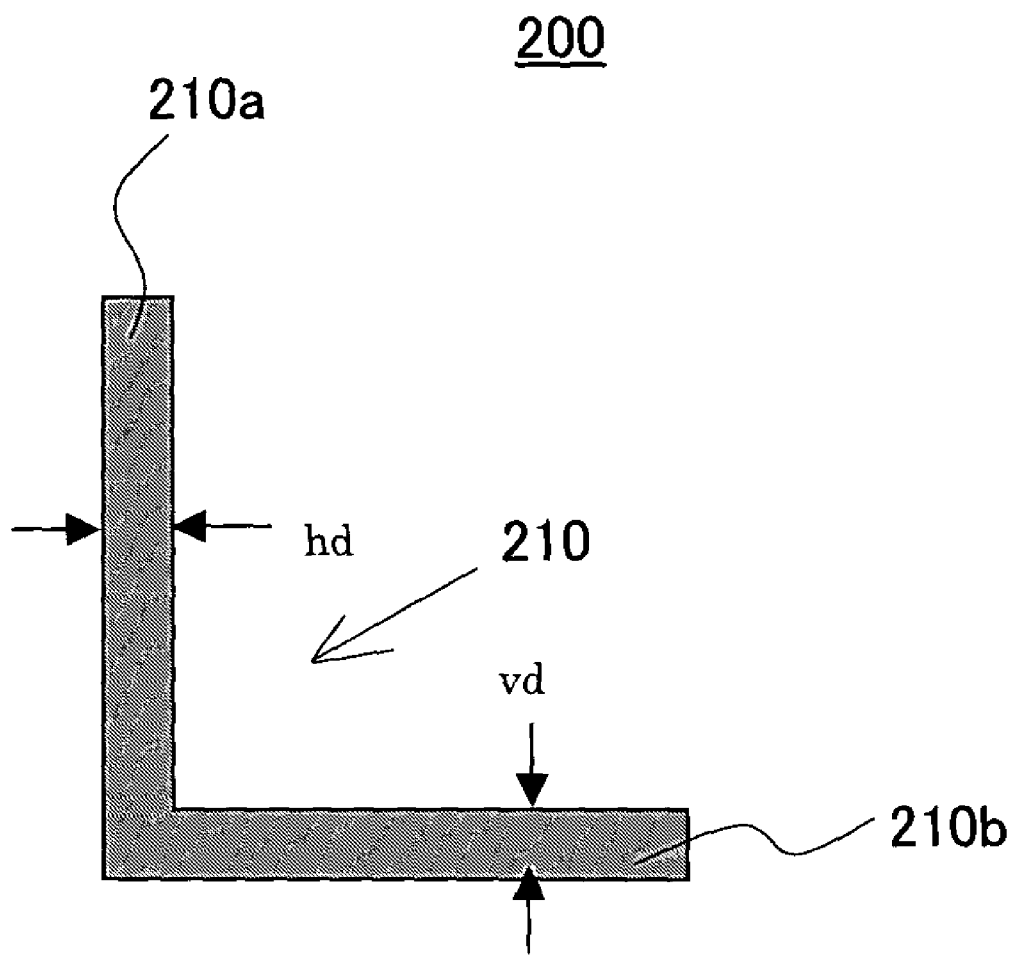
FIG. 3 is a schematic plan view showing details of a desired pattern on a mask shown in FIG. 2.

FIG. 3 is a schematic plan view showing details of the desired pattern 210 on the mask 200 shown in FIG. 2. The desired pattern 210 has an L shape in the instant embodiment, and requires such an image quality as can reduce a difference amount between a critical dimension hd of a longitudinal pattern 210a and a critical dimension vd of a lateral pattern 210b, i.e., $\Delta hv=(hd-vd)$ in FIG. 3. Therefore, the step 1004 of the exposure method 1000 sets image quality x in Equation 4 in step 1004 to be $\Delta hv$.

Figure 4:
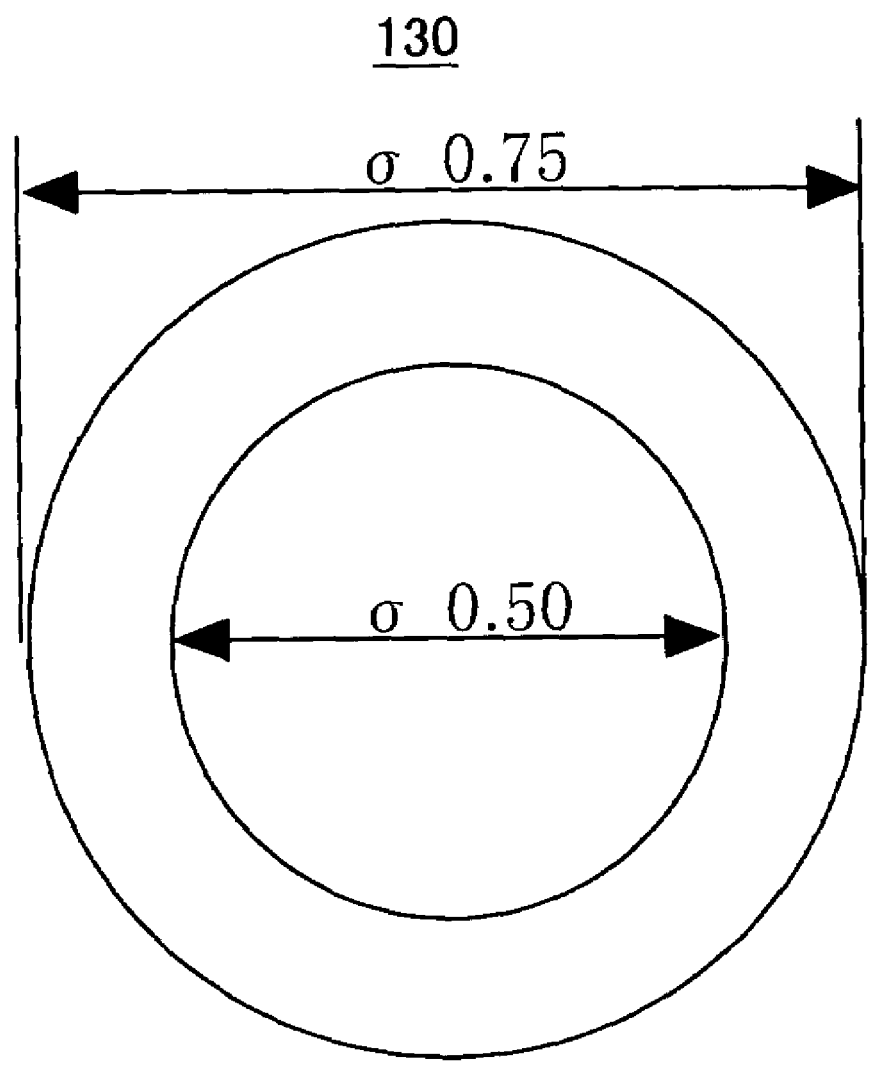
FIG. 4 is a schematic plan view showing an effective light source distribution of an illumination optical system before optimization.

FIG. 4 is a schematic plan view showing an effective light source distribution 130 of the illumination optical system 120 before optimization. The effective light source distribution 130 has, as shown in FIG. 4, an annular shape in which an outer diameter is 0.75 and an inner diameter of 0.50, for which a circle corresponding to the NA of the projection system 300 is set to be one. The effective light source shape 130 is typically implemented by the aperture stop 123 arranged just after an exit surface of the fly-eye lens 122 in the illumination optical system 120 of the exposure apparatus 1. The aperture stop 123 is located at a position conjugate with a pupil surface 310 in the projection optical system 300 in the exposure apparatus 1, and an aperture shape of the aperture stop 123 corresponds to an effective light source shape on the pupil surface 310 in the projection optical system 300.

Figure 5:
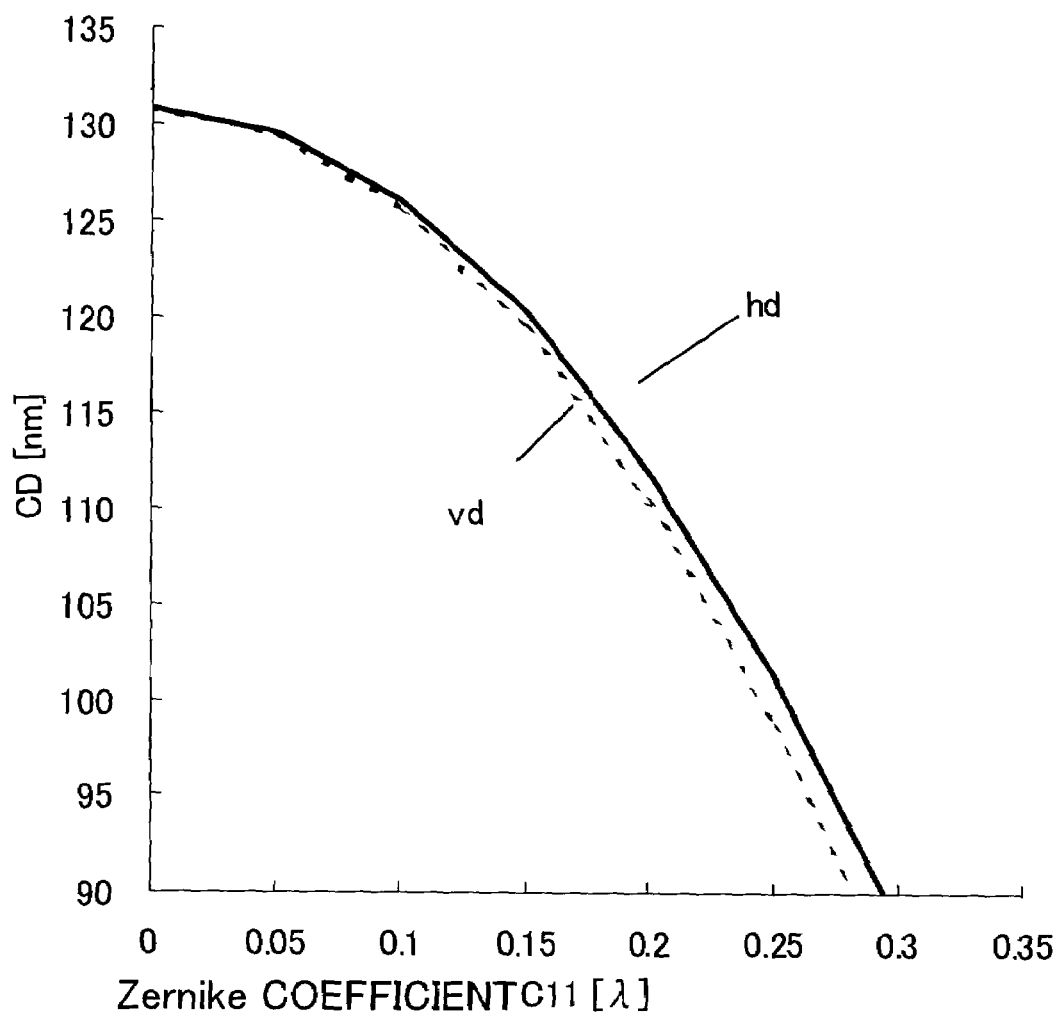
FIG. 5 is a graph showing changes of critical dimensions of patterns shown in FIG. 3 to a change of a Zernike coefficient.

The desired pattern 210 on the mask 200 shown in FIG. 3 is illuminated by the illumination apparatus 110 that includes the effective light source 130 shown in FIG. 4 and a KrF excimer laser as the light source section 110. An image is projected by the projection optical system 300 onto the plate 400. FIG. 5 is an exemplary result calculated by optical simulation, which represents how the critical dimension hd of the pattern 210a and the critical dimension vd of the pattern 210b change as a Zernike coefficient changes in the above projected image. Here, Table 1 indicates equations corresponding to Equation 1 of Zernike coefficient $C_i$ (i=1 to 36) used for calculation.

TABLE 1

| | m | n | $R_n^m(r)$ | | |
|---|---|---|---|---|---|
| C1 | 0 | 0 | 1 | | |
| C2 | 1 | 1 | R | $\cos\theta$ | DistX |
| C3 | 1 | 1 | | $\sin\theta$ | DistY |
| C4 | 0 | 2 | $2r^2 - 1$ | | Defocus |
| C5 | 2 | 2 | $R^2$ | $\cos 2\theta$ | As-SM |
| C6 | 2 | 2 | | $\sin 2\theta$ | As-HV |
| C7 | 1 | 3 | $3r^3 - 2r$ | $\cos\theta$ | ComaX |
| C8 | 1 | 3 | | $\sin\theta$ | ComaY |
| C9 | 0 | 4 | $6r^4 - 6r^2 + 1$ | | SA |
| C10 | 3 | 3 | $r^3$ | $\cos 3\theta$ | 3 leaf- |
| C11 | 3 | 3 | | $\sin 3\theta$ | Clover |
| C12 | 2 | 4 | $4r^4 - 3r^2$ | $\cos 2\theta$ | As-SM |
| C13 | 2 | 4 | | $\sin 2\theta$ | As-HV |
| C14 | 1 | 5 | $10r^5 - 12r^3 + 3r$ | $\cos\theta$ | ComaX |
| C15 | 1 | 5 | | $\sin\theta$ | ComaY |
| C16 | 0 | 6 | $20r^6 - 30r^4 + 12r^2 - 1$ | | SA |
| C17 | 4 | 4 | $r^4$ | $\cos 4\theta$ | |
| C18 | 4 | 4 | | $\sin 4\theta$ | |
| C19 | 3 | 5 | $5r^5 - 4r^3$ | $\cos 3\theta$ | 3 leaf- |
| C20 | 3 | 5 | | $\sin 3\theta$ | Clover |
| C21 | 2 | 6 | $15r^6 - 20r^4 + 6r^2$ | $\cos 2\theta$ | As-SM |
| C22 | 2 | 6 | | $\sin 2\theta$ | As-HV |
| C23 | 1 | 7 | $35r^7 - 60r^5 + 30r^3 - 4r$ | $\cos\theta$ | ComaX |
| C24 | 1 | 7 | | $\sin\theta$ | ComaY |
| C25 | 0 | 8 | $70r^8 - 140r^6 + 90r^4 - 20r^2 + 1$ | | SA |
| C26 | 5 | 5 | $r^5$ | $\cos 5\theta$ | |
| C27 | 5 | 5 | | $\sin 5\theta$ | |
| C28 | 4 | 6 | $6r^6 - 5r^4$ | $\cos 4\theta$ | |
| C29 | 4 | 6 | | $\sin 4\theta$ | |
| C30 | 3 | 7 | $21r^7 - 30r^5 + 10r^3$ | $\cos 3\theta$ | 3 leaf- |
| C31 | 3 | 7 | | $\sin 3\theta$ | Clover |
| C32 | 2 | 8 | $56r^8 - 105r^6r + 60r^4 - 10r^2$ | $\cos 2\theta$ | As-SM |
| C33 | 2 | 8 | | $\sin 2\theta$ | As-HV |
| C34 | 1 | 9 | $126r^9 - 280r^7 + 210r^5 - 60r^3 + 5r$ | $\cos\theta$ | ComaX |
| C35 | 1 | 9 | | $\sin\theta$ | ComaY |
| C36 | 0 | 10 | $252r^{10} - 630r^8 + 560r^6 - 210r^4 + 30r^2 - 1$ | | SA |
| (C49) | 0 | 12 | | | SA |

FIG. 5 is a graph showing changes of the critical dimension hd of the pattern 210a and of the critical dimension vd of the pattern 210b shown in FIG. 3 to a change of a Zernike coefficient $C_{11}$. Referring to FIG. 5, the critical dimension hd of the pattern 210a and of the critical dimension vd of the pattern 210b change in a form of a quadratic function, and may be expressed as follows where h0 and v0 are the critical dimension hd of the pattern 210a and the critical dimension vd of the pattern 210b without residual aberration in the projection optical system:

$$hd = a_h \times (C_{11})^2 + h0 \qquad (7)$$

$$vd = a_v \times (C_{11})^2 + v0 \qquad (8)$$

In other words, the image quality Δhv has a Zernike sensitivity coefficient $a_h$ and $a_v$ to the Zernikie coefficient $C_{11}$ among the Zernike sensitivity coefficients $a_{ijk}$ expressed by Equation 4 in step 1004 in the exposure method 1000.

Referring to FIG. 5, when the projection optical system 300 has such a residual aberration that the Zernike coefficient $C_{11}$ may enlarge, the projected image of the L-shaped desired pattern 210 shown in FIG. 3 degrades by Δhv.

The residual aberration represented by the Zernike coefficient $C_{11}$ has not been correctable by an aberration correction mechanism in the conventional exposure apparatus.

Accordingly, the optimal effective light source distribution is formed based on the inventive exposure method 1000 so as to improve the image quality due to the residual aberration of the projection optical system 300.

Figure 6:
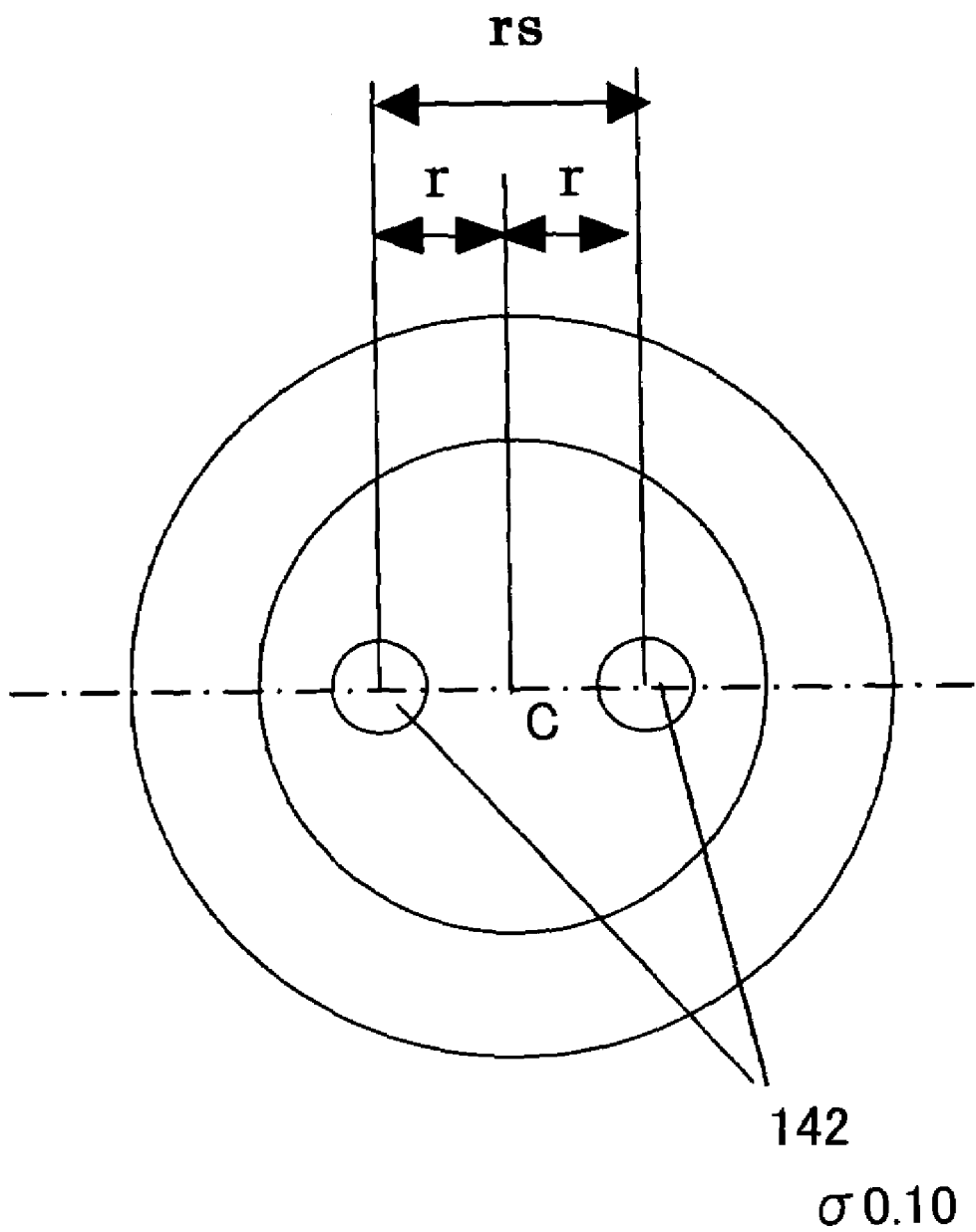
FIG. 6 is a schematic plan view showing an effective light source distribution for calculating a Zernike sensitivity coefficient.

As discussed, the exposure method 1000 may create a database indicative of changes of the image quality of a projected image for each point light source to a change amount of the Zernike coefficient for each Zernike term, i.e., a Zernike sensitivity coefficient for all the effective light source positions. This database may determine the optimal effective light source distribution from a combination of point light sources having different intensities that may optimize the image quality of the projected image of the desired pattern 210. A description of the instant embodiment will be given for simplicity purposes of a method of improving the image quality Δhv by adding, as shown in FIG. 6, two effective light source shapes 142 having a diameter of 0.10 on a horizontal line through a center C of the effective light source shape 140, and optimizing the effective light source shape 140 by expressing the Zernike sensitivity coefficient using quadratic functions $a_h$ and $a_v$. Here, FIG. 6 is a schematic plan view showing the effective light source distribution 140 for calculating a Zernike sensitivity coefficient.

Table 2 shows changes of Zernike sensitivity coefficients $a_h$ and $a_v$ of the critical dimension hd of the pattern 210a and the critical dimension vd of the pattern 210b as the Zernike coefficient $C_{11}$ changes when an interval rs between two effective light sources 142 varies. Values in Table 2 correspond to a result that the exposure method 1000 calculates the Zernike sensitivity coefficient $a_{ijk}$ only for the Zernike coefficient $C_{11}$.

TABLE 2

|  | $a_h$ | $a_v$ | $a_h - a_v$ |
| --- | --- | --- | --- |
| No Effective Light Source Added | −0.470 | −0.511 | 0.041 |
| RS = 0 | −0.488 | −0.498 | 0.011 |
| Rs = 0.15 | −0.493 | −0.482 | −0.010 |
| Rs = 0.25 | −0.472 | −0.478 | 0.006 |
| Rs = 0.35 | −0.452 | −0.475 | 0.023 |
| Rs = 0.45 | −0.450 | −0.480 | 0.030 |
| Rs = 0.75 | −0.520 | −0.475 | −0.046 |
| Rs = 0.85 | −0.568 | −0.442 | −0.126 |

It is understood from Table 2 that the effective light source shape 130 of the illumination optical system 120 before optimization shown in FIG. 4 indicates a large difference between the Zernike sensitivity coefficients $a_h$ and $a_v$, and the projected image of the L-shaped desired pattern 210 shown in FIG. 2 has a degraded image quality Δhv when the projection optical system 300 has such a residual aberration that the Zernike coefficient $C_{11}$ becomes large.

Figure 7:
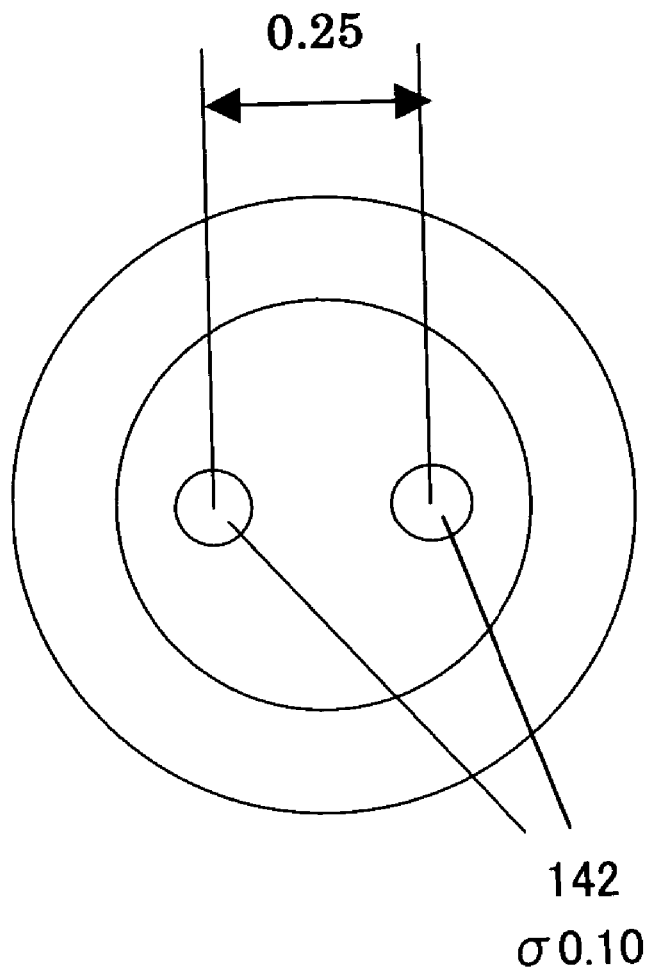
FIG. 7 is a schematic plan view showing an effective light source distribution of an illumination optical system after optimization.

On the other hand, it is understood from Table 2 that a difference between the Zernike sensitivity coefficients $a_h$ and $a_v$ reduces when two small effective light sources 142 are added as shown in FIG. 6. In other words, it is understood that a degradation of the image quality Δhv may be ameliorated by adding two effective light sources apart from each other by an interval rs=0.25, even when the projection optical system 300 has such a residual aberration as enlarges the Zernike coefficient $C_{11}$. In other words, the required optimized effective light source shape calculated from the exposure method 1000 is the effective light source shape 150 that adds two effective light sources 142 apart from each other by the interval rs=0.25. FIG. 7 is a schematic plan view showing the effective light source distribution 140 of the illumination optical system 120 after optimization.

Figure 8:
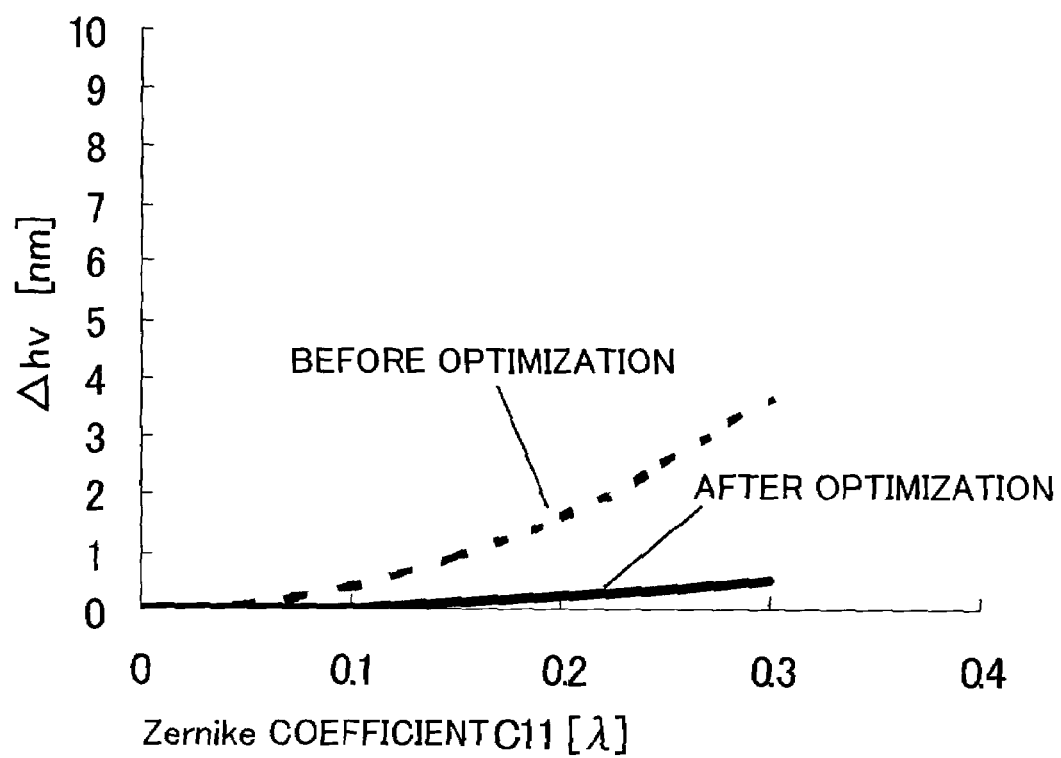
FIG. 8 is a graph showing changing image quality due to residual aberration in a projection optical system expressed by a Zernike coefficient in effective light source distributions before and after optimization.

FIG. 8 shows a result that compares the effective light source distribution 130 of the illumination optical system 120 before optimization shown in FIG. 4 with the optimal effective light source shape show in FIG. 7 with respect to changes of Δhv when the Zernike coefficient $C_{11}$ actually changes. It is understood from FIG. 8 that when the effective light source distribution 130 is replaced with an optimal effective light source distribution 140 shown in FIG. 7, the image quality degradation Δhv reduces even when the projection optical system 300 has a large residual aberration represented by the Zernike coefficient $C_{11}$. Here, FIG. 8 is a graph showing changes of image quality Δhv due to residual aberration in a projection optical system 300 expressed by the Zernike coefficient $C_{11}$ in effective light source distributions 130 and 140 before and after optimization.

The above description is simplified for a better understanding of the inventive procedure and effects of image quality improvement through an optimization of an effective light source shape. The actual inventive procedure follows the flowchart shown in FIG. 1, as discussed. A more detailed description will now be given of an optimization procedure of an effective light source, which follows the flowchart shown in FIG. 1, so as to indicate how the above description has been simplified.

Figure 16:
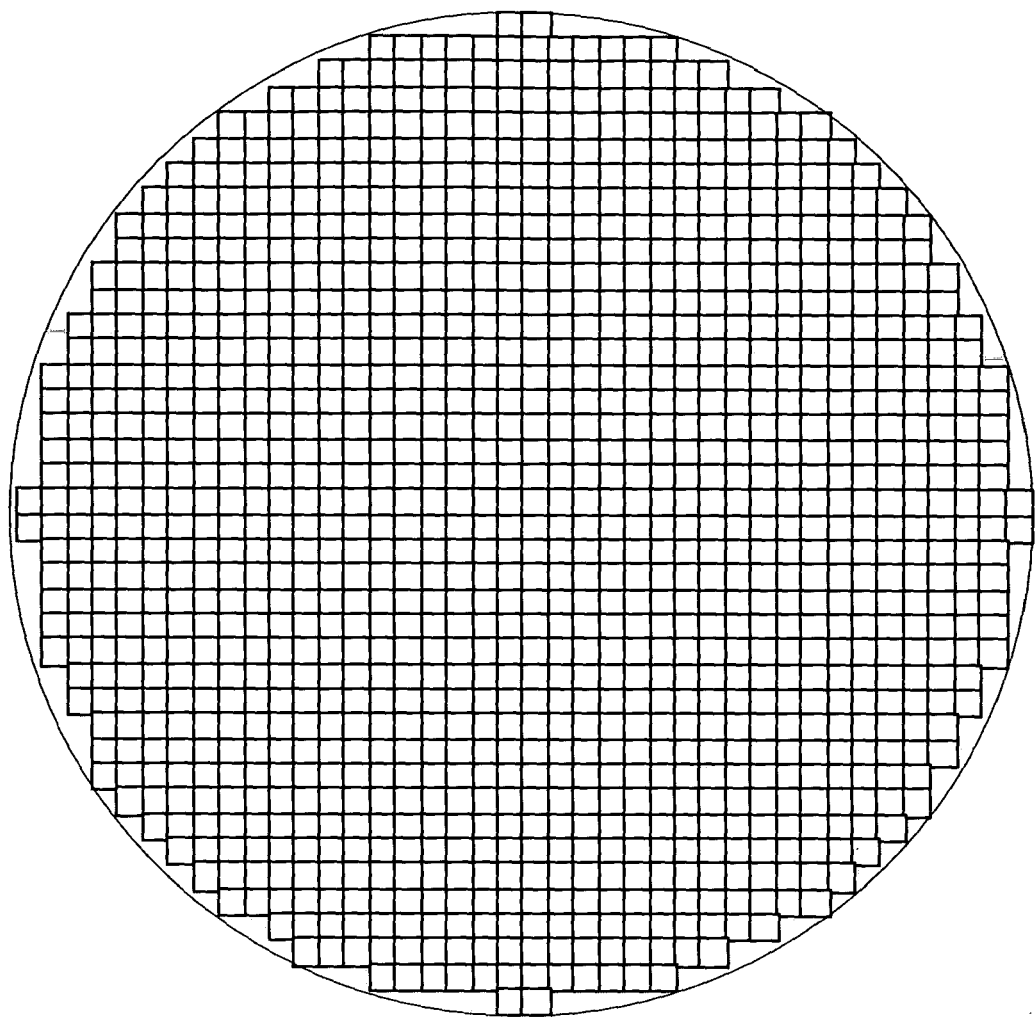
FIG. 16 shows divided effective light sources of one embodiment according to the present invention.

The procedure shown in FIG. 1 initially divides an effective light source to illuminate a mask into plural point light sources (step 1002). FIG. 16 shows divided effective light sources of the instant embodiment. As shown in FIG. 16, the instant embodiment divides a circular effective light source area having σ=1.0 into plural square point light sources in which each side has a length of 0.025σ. In FIG. 16, the effective light source shape is divided into 1184 square light sources.

As discussed, an arbitrary effective light source shape IL may be expressed by Equation 3 using intensity $b_{ij}$ of each point light source. In forming an arbitrary effective light source shape using an aperture stop, the intensity $b_{ij}$ is either one when the illumination light transmits through the stop or zero when the illumination light is shielded by the stop, since the effective light source shape is determined by whether the illumination transmits through the stop or is shielded by the stop. Therefore, the instant embodiment may express $b_{ij}$ by using either zero or one.

Figure 17:
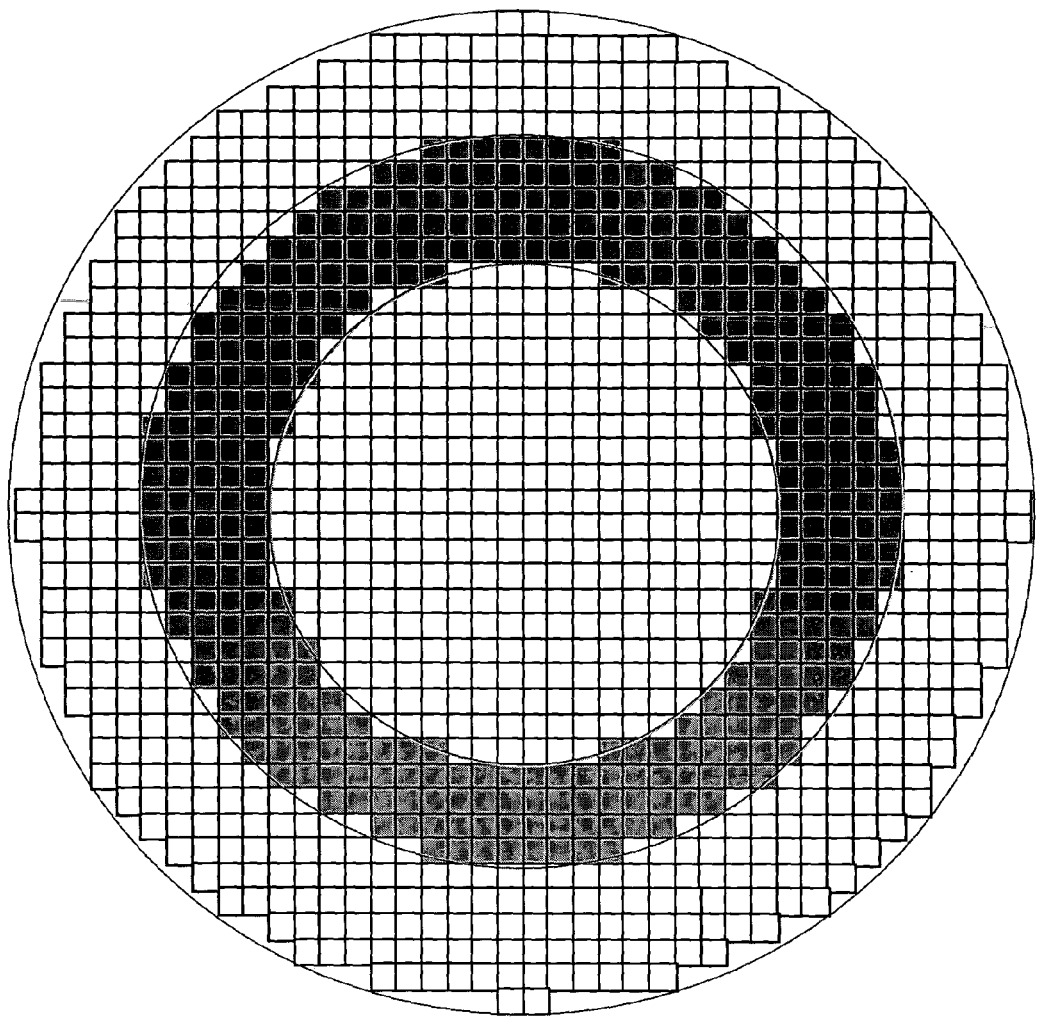
FIG. 17 is an effective light source shape before optimization, expressed by point light sources.

For example, FIG. 17 is an effective light source shape before optimization, expressed by point light sources. FIG. 17 shows the hatched point light sources with $b_{ij}=1$ and the unhatched point light sources with $b_{ij}=0$. Then, Zernike sensitivity coefficient $a_{ijk}$ is calculated for each point light source $P_{ij}$ to Zernike coefficient $C_k$ of image quality $\Delta hv$ of a pattern shown in FIG. 3 (step 1004). The Zernike sensitivity coefficient $a_{ijk}$ is calculated for all the point light sources $P_{ij}$ and all the Zernike coefficients $C_k$ (steps 1006 and 1008). As a result, the Zernike sensitivity coefficient table is obtained as shown in Table 3 below.

TABLE 3

|  |  | $C_1$ | $C_2$ | $C_3$ | ... | $C_{36}$ |
|---|---|---|---|---|---|---|
| $P_1$ | $b_1$ | $a_{1,1}$ | $a_{1,2}$ | $a_{1,3}$ | ... | $a_{1,36}$ |
| $P_2$ | $b_2$ | $a_{2,1}$ | $a_{2,2}$ | $a_{2,3}$ | ... | $a_{2,36}$ |
| $P_3$ | $b_3$ | $a_{3,1}$ | $a_{3,2}$ | $a_{3,3}$ | ... | $a_{3,36}$ |
| . | . | . | . | . |  | . |
| . | . | . | . | . |  | . |
| . | . | . | . | . |  | . |
| $P_{1184}$ | $b_{1184}$ | $a_{1284,1}$ | $a_{1184,2}$ | $a_{1184,3}$ | ... | $a_{1184,36}$ |

Table 3 uses a suffix of a serial number n (n=1 to 1184) instead of matrix numbers i, j to indicate positions of point light sources for brief notation. In the instant embodiment, a function $f(C_k)$ in Equation 4 is expressed by a quadratic function of $C_k$, as discussed. Therefore, the image quality of $\Delta hv$ of a pattern in an arbitrary effective light source shape may be calculated by the following equation:

$$\Delta hv = \Sigma a_{nk}(P_{nk}) \times b_{nk} \times C_k^2 \qquad (8)$$

Here, when the following $A_k$ is defined, $A_k$ expresses the Zernike sensitivity of the image quality $\Delta hv$ in an arbitrary effective light source shape:

$$A_k = \Sigma a_{nk}(P_{nk}) \times b_{nk} \qquad (9)$$

Figure 18:
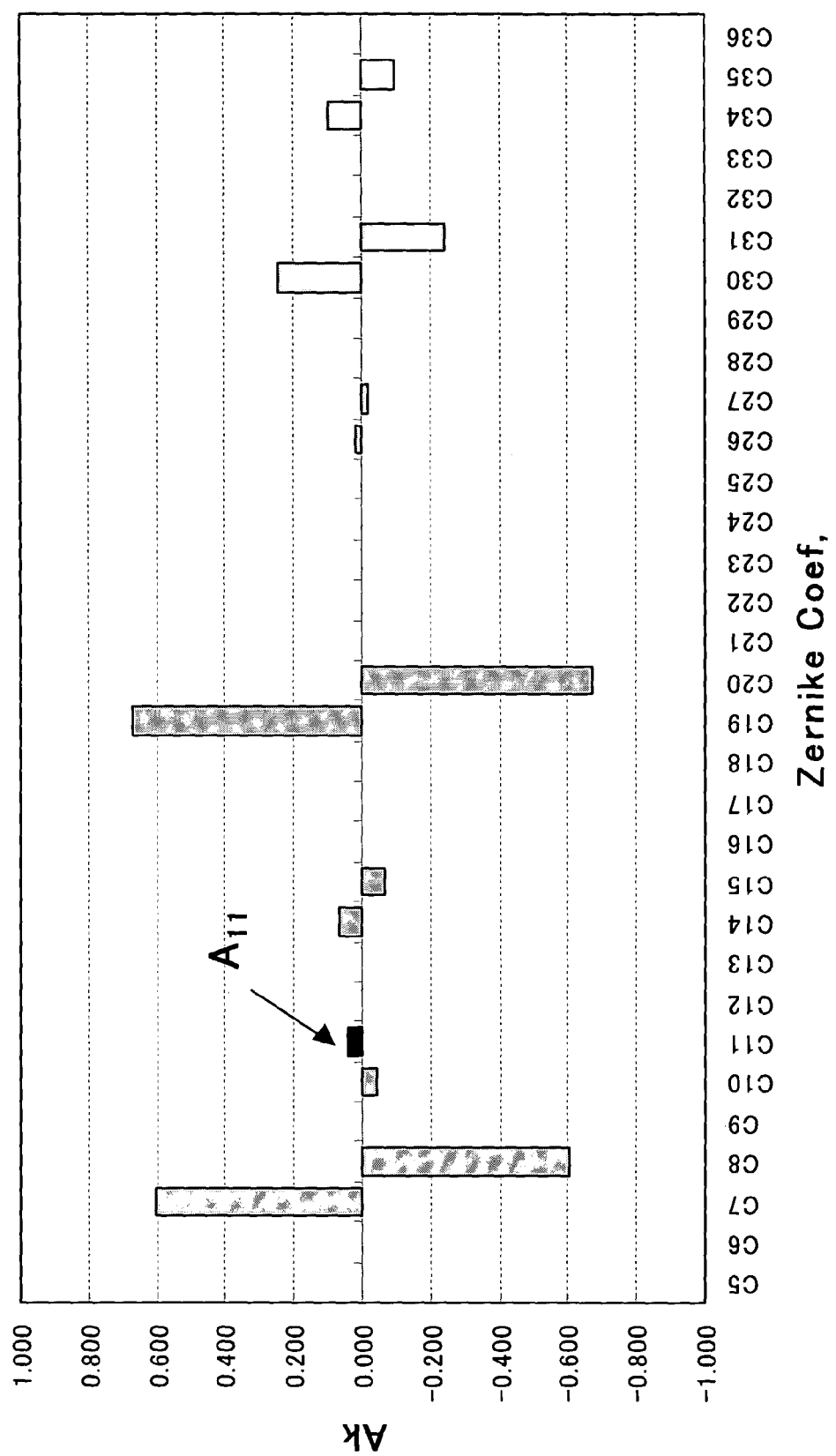
FIG. 18 is a graph of a Zernike sensitivity of the effective light source shown in FIG. 17.
Figure 19:
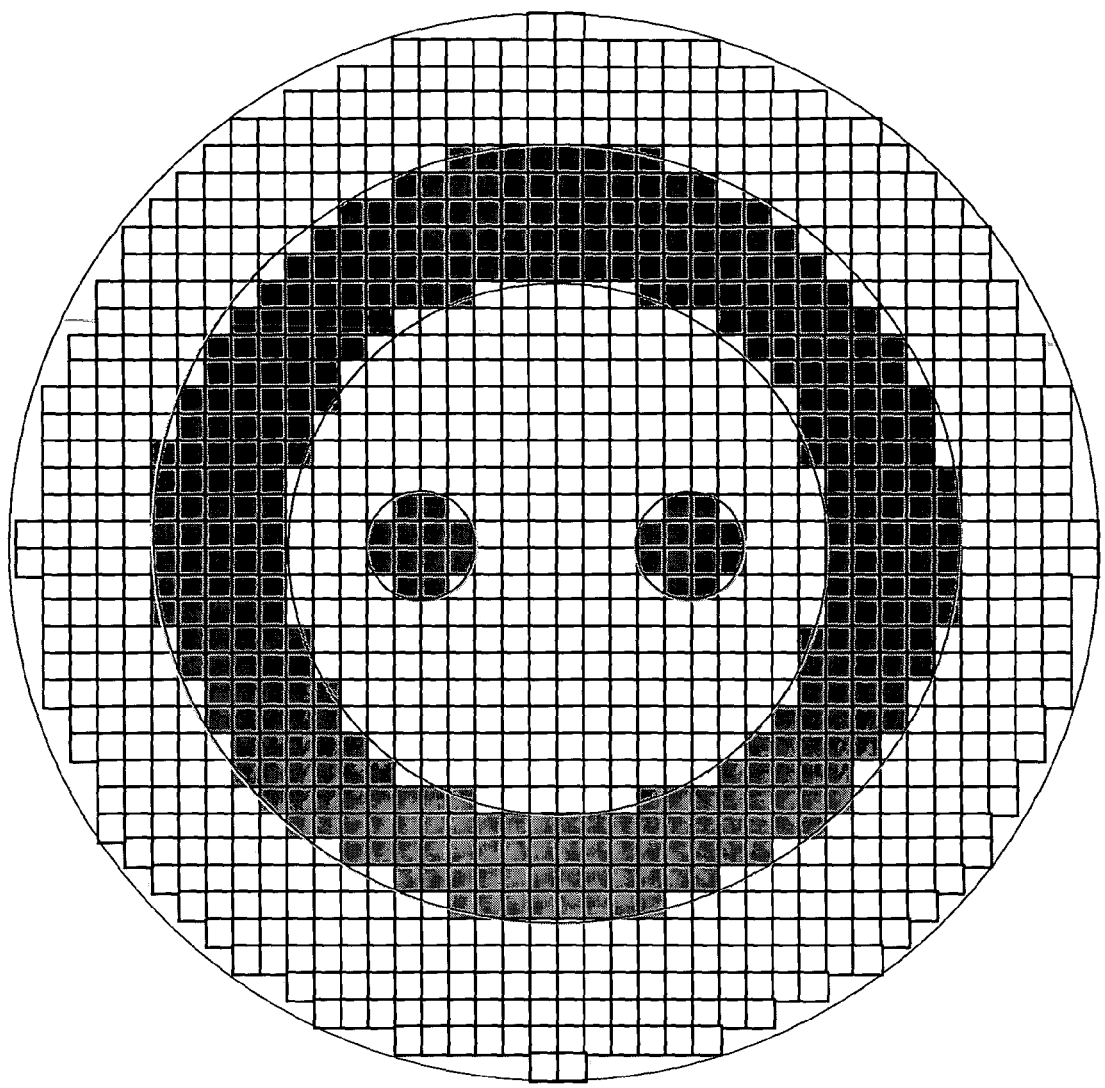
FIG. 19 is a view that uses intensities of point light sources of a divided optimized effective light source shown in FIG. 7.
Figure 20:
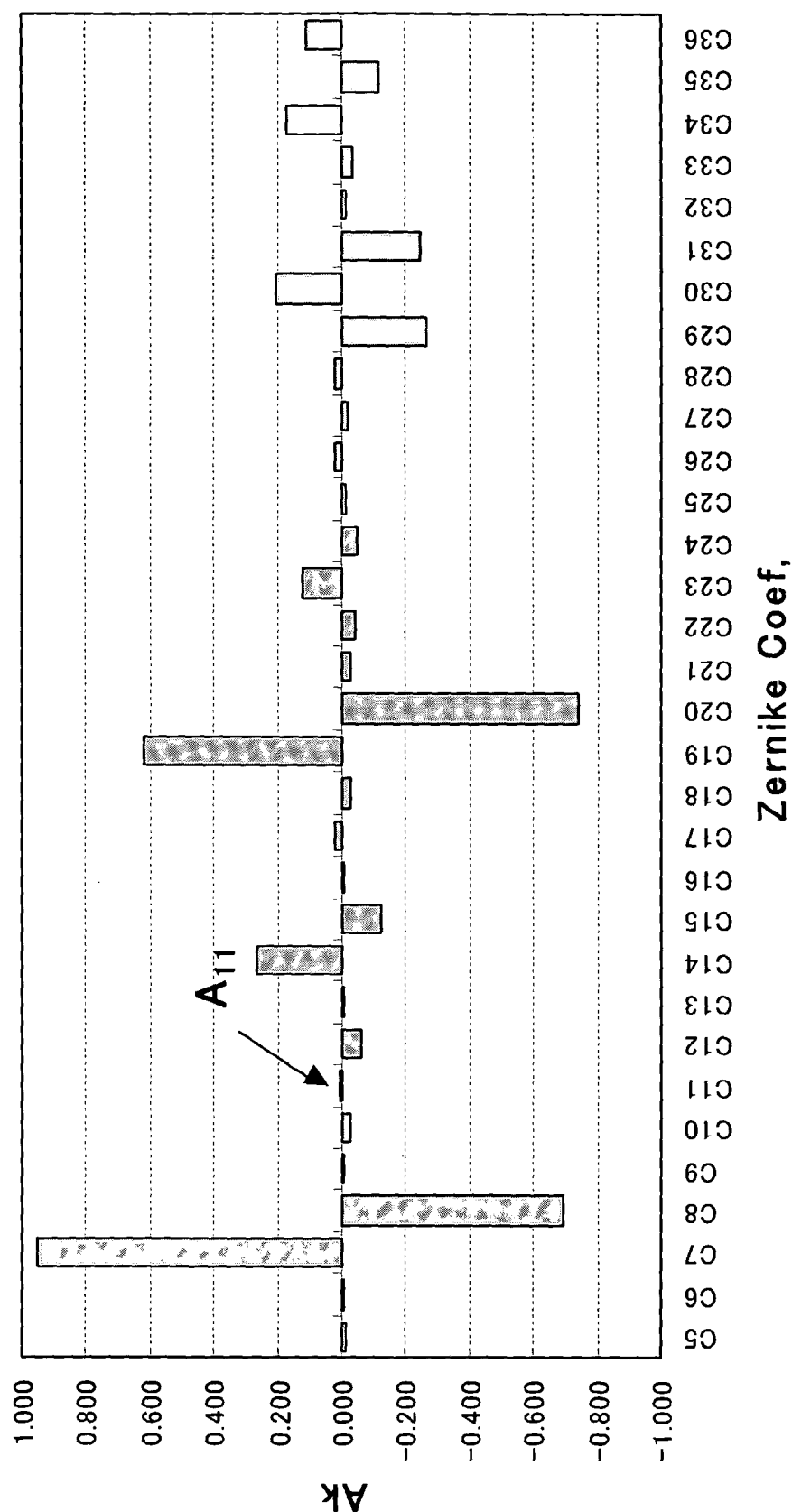
FIG. 20 is a graph of a Zernike sensitivity obtained from FIG. 19.

In Equation 9, $b_{nk}$ has a value of only zero or one according to positions of the point light sources, and $A_k$ may be calculated by a sum of Zernike sensitivity of point light sources with $b_{nk}=1$. For example, $A_k$ is a sum of Zernike sensitivities of hatched point light sources in the effective light source shape shown in FIG. 17. FIG. 18 is a graph of Zernike sensitivity $A_k$ in the thus-calculated effective light source shape shown in FIG. 17. Similarly, FIG. 19 is a view that uses intensities of point light sources of an optimized divided effective light source shape, and FIG. 20 is a graph of Zernike sensitivity $A_k$ in this effective light source shape.

The instant embodiment assumes that only the aberration is large which corresponds to a term of Zernike coefficient $C_{11}$ and terms of Zernike coefficients other than $C_{11}$ are very small or regarded as zero, whereby Equation 8 calculates only k=11. In other words, only $A_{11}$ for each effective light source shown in FIG. 7 is determined which may restrain deterioration of the image quality $\Delta hv$, which is expressed by Zernike coefficient $C_{11}$, due to residual aberration in the projection optical system 300 (steps 1010 and 1012).

Thus, when the projection optical system 300 has a residual aberration, and the optimal effective light source distribution formed in the illumination optical system 120 corrects the image quality degradation of the projected image of the desired pattern 210 on the mask 200 onto the plate 400, which is caused by the residual aberration, the effective light source is regarded as an aggregate of point light sources each having an arbitrary area. In addition, the optimal effective light source distribution for improvement of image quality is easily determined using the database or table as shown in Table 2, which has been formed by calculating a change of the image quality of a projection image for a point light source to a change amount of the Zernike coefficient for each Zernike term, i.e., Zernike sensitivity coefficients for all the effective light source positions.

For simplicity purposes, the instant embodiment calculates on the assumption that the residual aberration of the projection optical system 300 generates only aberration corresponding to the Zernike coefficient $C_{11}$, and Table 2 indicates the Zernike sensitivity coefficient to the Zernike coefficient $C_{11}$ term. Nevertheless, the optimal effective light source distribution may be determined when the residual aberration generates a term other than the Zernike coefficient $C_{11}$ term, by similarly calculating the Zernike sensitivity coefficient to the Zernike coefficient term.

When the residual aberration of the projection optical system 300 may be expressed by a combination of plural Zernike coefficient terms, the optimal effective light source distribution that minimizes the image quality degradation is determined by calculating the Zernike sensitivity coefficient to plural Zernike coefficients, and by expressing the image quality degradation of the projected image as a function of plural Zernike sensitivities.

While the instant embodiment assumes the L-shaped desired pattern 210 formed on the mask 200 and the image quality degradation $\Delta hv$ to be improved, the optimal effective light source distribution that minimizes the image quality degradation is determined by calculating the Zernike sensitivity coefficient to target image qualities for different shaped patterns, which are evaluated by different amounts. When there are plural target image qualities, the optimal effective light sources may be determined similarly.

The step of calculating the Zernike sensitivity coefficients of image quality of the desired pattern to be improved and storing them as a database, and the step of determining the optimal effective light source shape with reference to the database may be implemented as software for automatic calculation. Such a program also constitutes one aspect of the present invention.

A system for determining the optimal effective light source distribution may be configured, which includes a memory that stores the database, and a computer. The controller 600 in the exposure apparatus 1 in this embodiment serves as the system for determining the optimal effective light source distribution.

Optionally, the optimally effective light distribution to aberration of the projection optical system 300 in the exposure apparatus 1 may be automatically calculated for feedback control over the exposure apparatus 1. For example, an exposure system may include a mechanism that may vary an effective light source distribution into an arbitrary shape, and automatically vary the optimal effective light source distribution in accordance with a calculation result.

A description will be given of an exposure system that uses a digital mirror device ("DMD"), Texas Instruments, as the mechanism that may vary an effective light source distribution.

Figure 9:
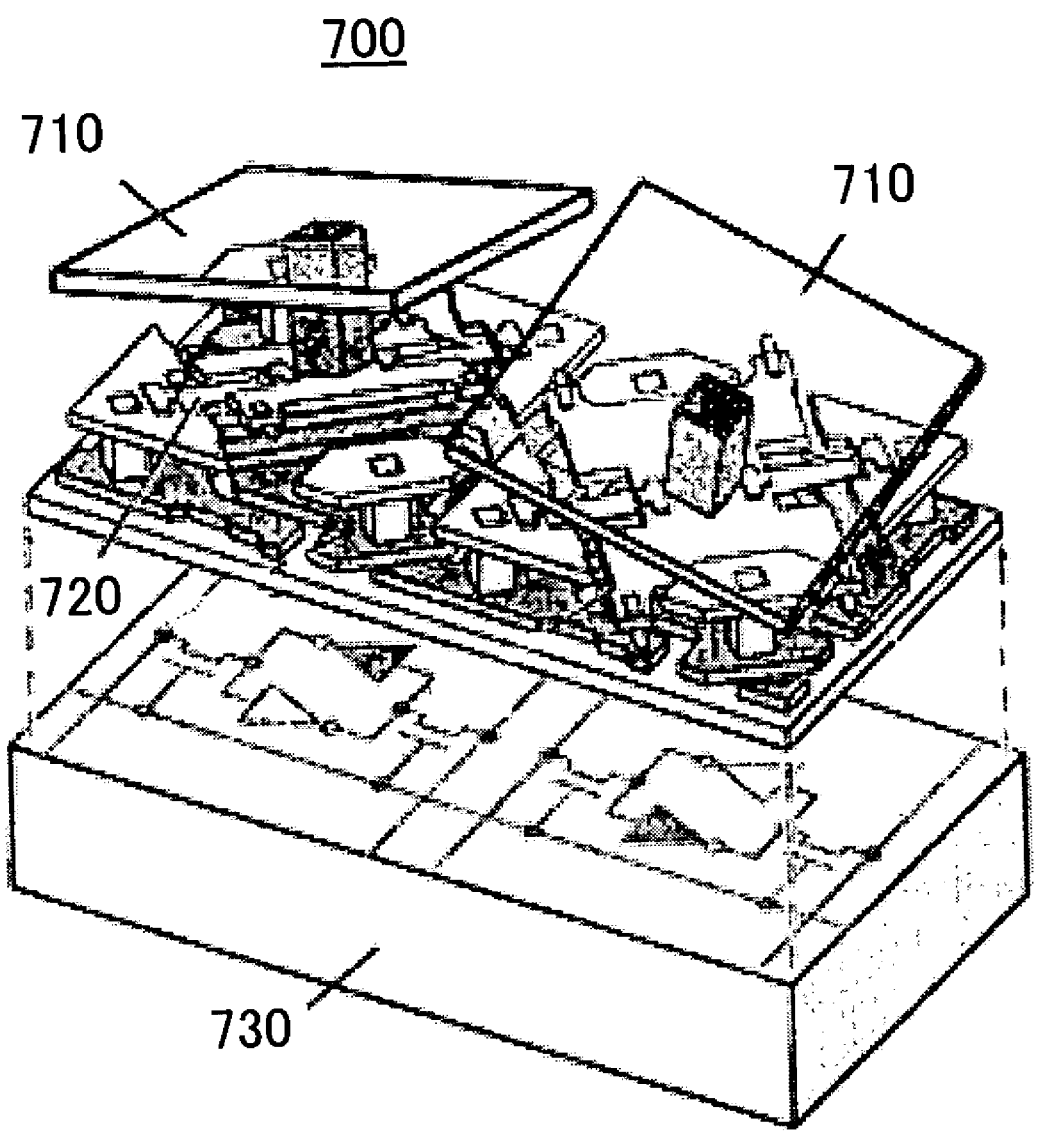
FIG. 9 is a schematic perspective view showing a digital mirror device.

FIG. 9 is a schematic structure of the DMD 700. Fine mirrors are arranged like a lattice on a surface of the DMD 700, and form one mirror surface. Each fine mirror 710 is supported by a torque hinge 720 for variable inclination. Turning on and off of a pair of drive electrodes under the mirrors 710 would be able to abstract the mirrors 710 with an electrostatic force and control inclinations. In other words, an angle of the mirror 710 may be controlled within a range of ±10° for each fine area into which the mirror surface is divided. A control electronic circuit 730 is arranged under the drive mechanism for the fine mirrors, and may control mirror driving more than five thousand times per second in response to an input control signal.

Figure 10:
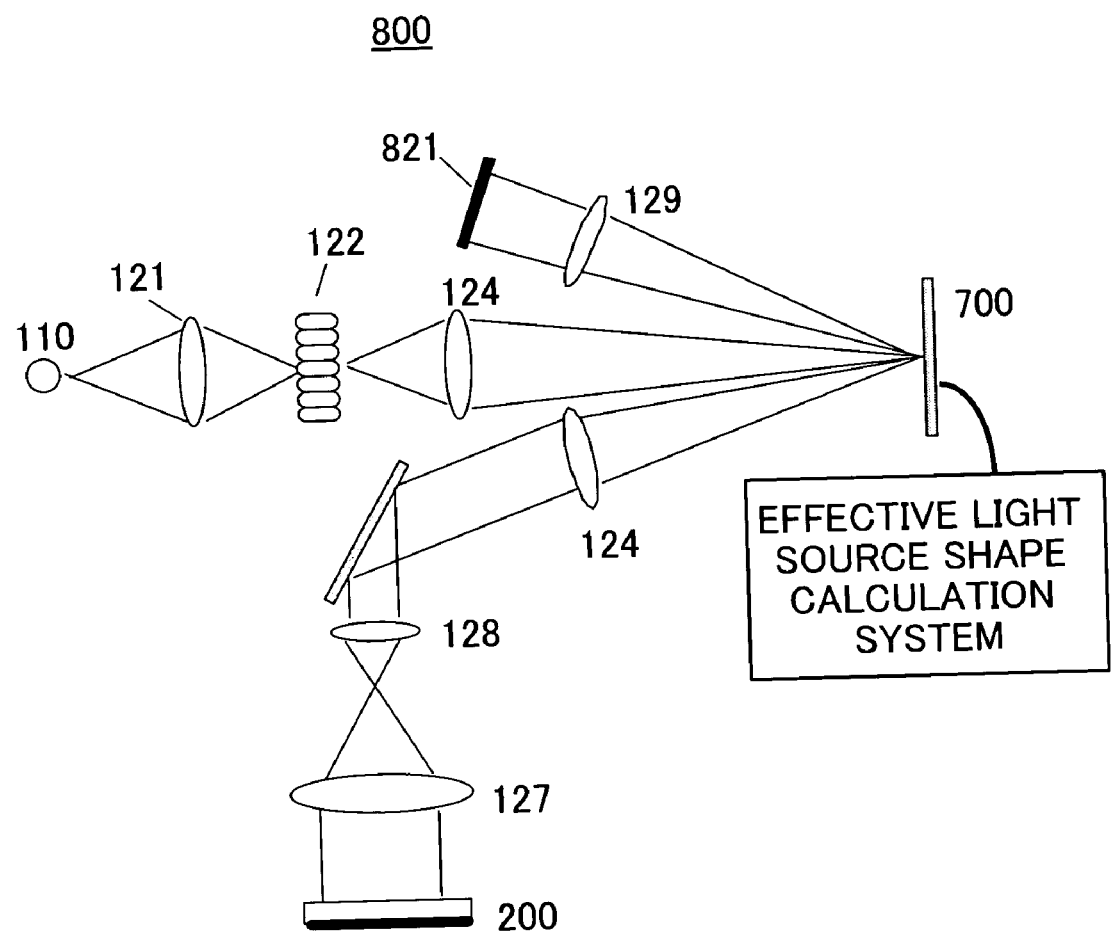
FIG. 10 is a schematic structure showing an exemplary illumination apparatus that uses the digital mirror device shown in FIG. 9 to arbitrarily vary a shape of an effective light source distribution.

FIG. 10 is a schematic structure showing an exemplary illumination apparatus 800 that uses the DMD 700 shown in FIG. 9 to arbitrarily vary a shape of an effective light source distribution. Referring to FIG. 10, light emitted from the light source section 110 images on the fly-eye lens 122 by the input lens 121. In other words, the illumination apparatus 800 provides Koehler illumination using the fly-eye lens 122 as a secondary light source. The DMD 700 is arranged at a position conjugate, through the relay lens 124, with an exit surface of the fly-eye lens 122, and the exit surface of the fly-eye lens 122 images on the mirror surface of the DMD 700. In other words, the secondary light source shape or effective light source shape is projected on the mirror surface of the DMD 700.

Figure 11:
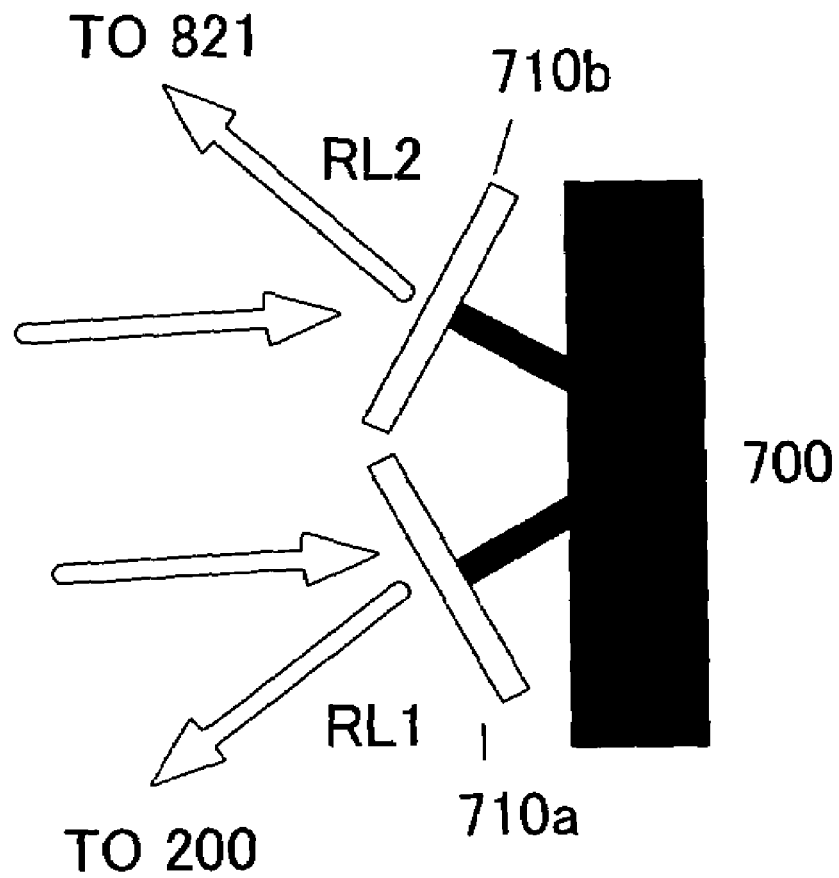
FIG. 11 is a partial enlarged view of the digital mirror device shown in FIG. 10.

Here, as shown in FIG. 11, among fine mirrors 710 in the DMD 700, the mirror 710a is inclined by −10°, which corresponds to a part used for the effective light source distribution, while the mirror 710b is inclined by +10°, which correspond to a part unused for the effective light source distribution. FIG. 11 is a partial enlarged view of the DMD 700 shown in FIG. 10.

The reflected light RL1 from the mirror 700a inclined by −10° directs in a lower left direction, and illuminates the mask 200 surface through the relay lens 126 and 128, and condenser lens 127. On the other hand, the reflected light RL2 from the mirror 700b inclined by +10° directs in an upper left direction, and is absorbed by a light absorber 821 through the relay lens 129 shown in FIG. 10.

In other words, only the reflected light RL1 from the mirror 710b inclined by −10° illuminates the mask 200 surface, and control over positions of the mirrors 710a and 710b arbitrarily, which are to be inclined by 10°, would arbitrarily vary a shape of the effective light source shape of the illumination light for illuminating the mask 200.

Figure 12:
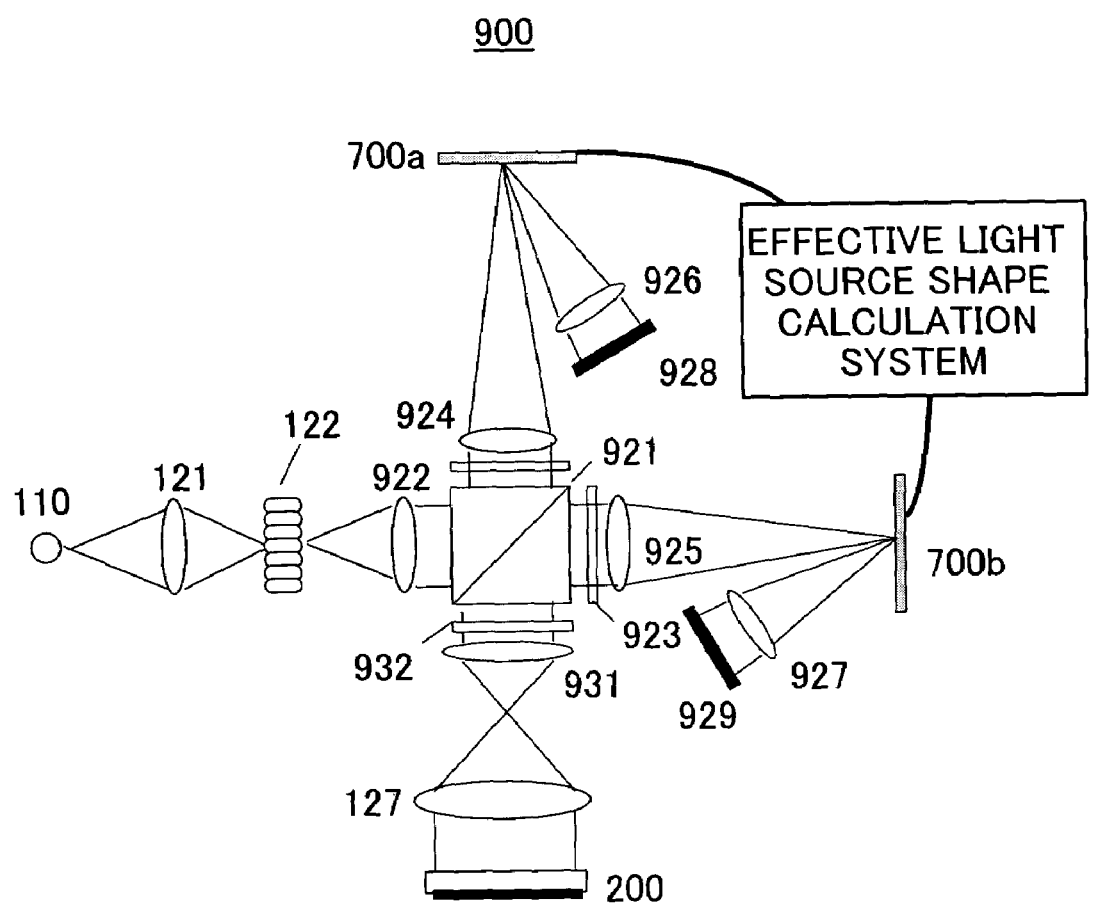
FIG. 12 is a schematic structure showing another exemplary illumination apparatus that uses the digital mirror device shown in FIG. 9 to arbitrarily vary a shape of an effective light source distribution.

FIG. 12 is a schematic structure showing another exemplary illumination apparatus 900 that uses the DMD 700 shown in FIG. 9 to arbitrarily vary a shape of an effective light source distribution. The illumination apparatus 900 provides Koehler illumination using the fly-eye lens 122 as a secondary light source, similar to the illumination apparatus 800 shown in FIG. 10. The polarization beam splitter 921 is arranged on a subsequent stage of the fly-eye lens 122, and an optical path is divided into two according to a polarization stage of the illumination light. The illumination light divided into two light paths reaches the DMD 700a through a λ/4 plate 922 and a relay lens 924, and a DMD 700 b through a λ/4 plate 932 and a relay lens 925. Similar to the illumination apparatus 800 shown in FIG. 10, the DMDs 700a and 700b in the illumination apparatus 900 are arranged conjugate with the fly-eye lens 122, and the effective light source distribution according to a polarization state is projected onto the DMD mirror surface.

Figure 13:
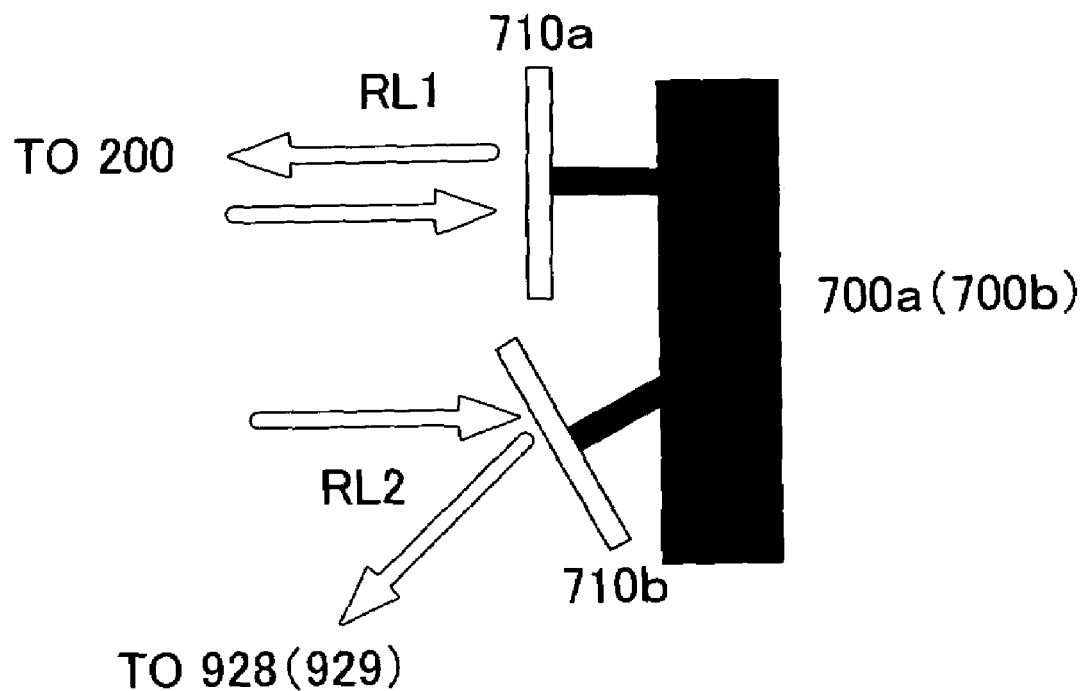
FIG. 13 is a partial enlarged view of the digital mirror device shown in FIG. 12.

Here, as shown in FIG. 13, the DMDs 700a and 700b, the mirror 710a, as a part used for the effective light source for illuminating the mask 200, is inclined by 0° and the mirror 710b, as a part unused for the effective light source for illuminating the mask 200 is inclined by −10°. The illumination light RL1 projected by the mirror 710a inclined by 0° regularly reflects on the mirror 710a and enters the beam splitter 921 again through the λ/4 plates 922 and 923. On the other hand, the reflected light RL2 from the mirror 710b inclined by −10° directs in a lower left direction, and is absorbed by a light absorber 928 or 929 through the relay lens 926 or 927 shown in FIG. 12. FIG. 13 is a partial enlarged view of the DMD 700 shown in FIG. 12.

The illumination light RL1 that has regularly reflected on the mirror 710a passes through the λ/4 plates 922 and 923 twice for reciprocation, and illuminates the mask 200 surface through the beam splitter 921, relay lens 931, and condenser lens 127 while inverting its polarization state.

In this case, a loss of light amount of illumination light may reduce by associatively driving the DMD 700a and 700b and, by accordingly, shapes of effective light sources formed on two light paths divided by the beam splitter.

A λ/4 plate 932 may be arranged between a beam splitter 921 and a relay lens 931 so as to make illumination light that illuminates the mask 200 surface non-polarized. Incoherent light may be used for the light source section 110 when non-uniform light intensity of illumination light changes due to interference bands.

Thus, use of a DMD 700 would implement an illumination apparatus that may arbitrarily vary an effective light source distribution of the illumination light. In order to arbitrarily vary a shape of the effective light source, the illumination optical system 120 holds the aperture stop 123 that may form an optimal effective light source distribution if necessity arises according to a type of a desired pattern, and automatically switches the aperture stop 120 using a control mechanism (not shown). Alternatively, the aperture stop 123 may be implemented as a mechanism such as a liquid crystal device, in which an arbitrary position may switch between a transmission and shield of illumination light, and a control unit (not shown) may automatically form an arbitrary shape.

Figure 14:
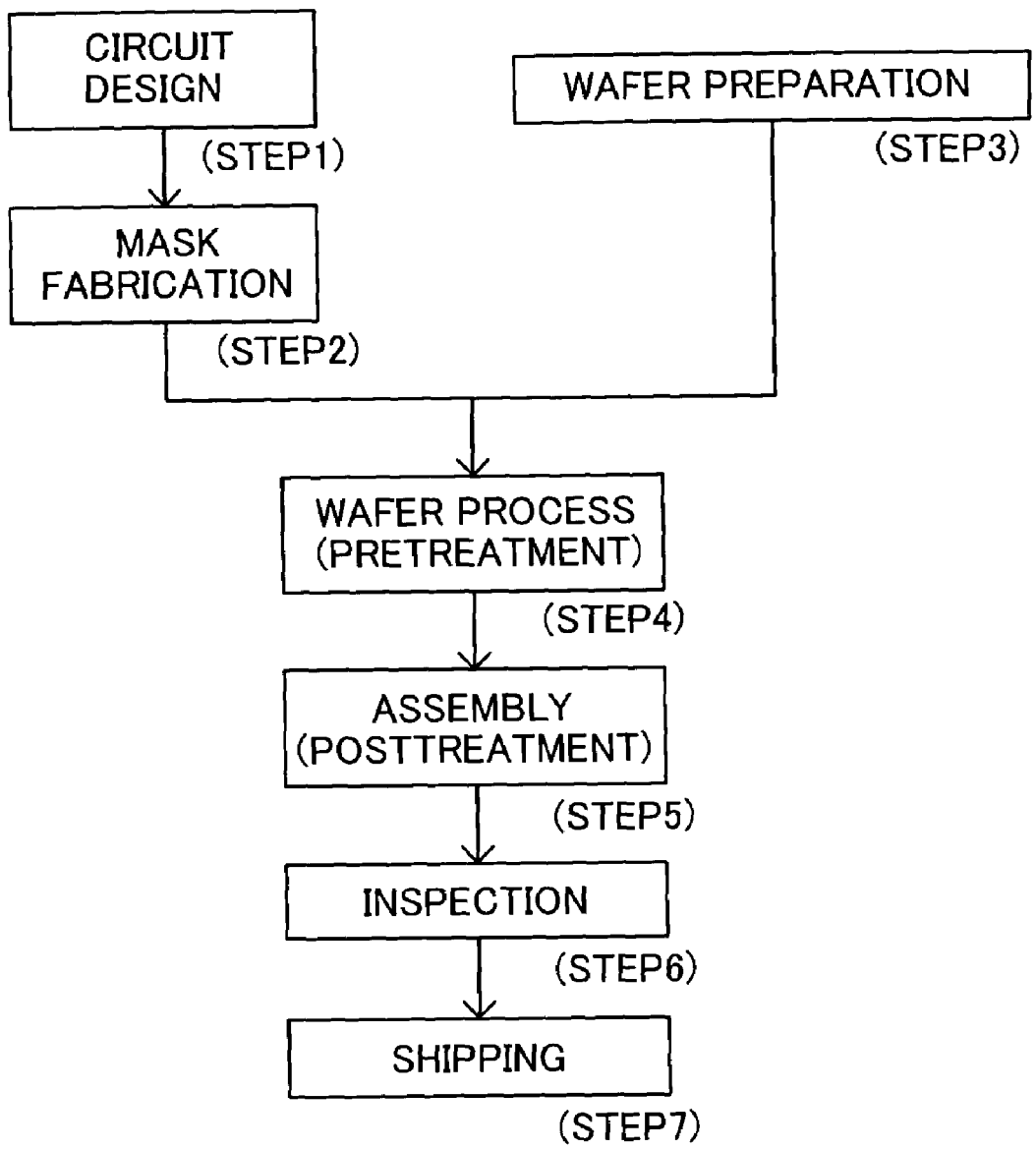
FIG. 14 is a flowchart for explaining how to fabricate devices (such as semiconductor chips, such as ICs and LCDs, CCDs, and the like).
Figure 15:
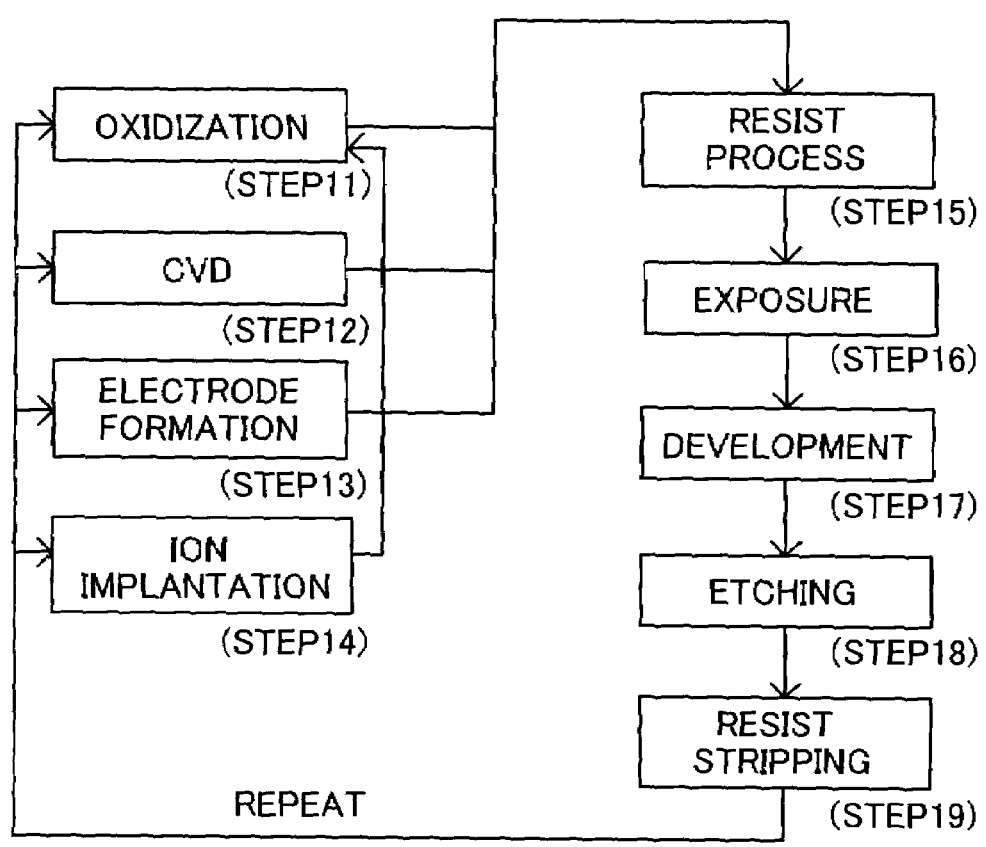
FIG. 15 is a detailed flowchart of a wafer process shown in Step 4 of FIG. 14.

Referring now to FIGS. 14 and 15, a description will be given of an embodiment of a device fabricating method using the above exposure apparatus 1. FIG. 14 is a flowchart for explaining fabrication of devices (i.e., semiconductor chips such as ICs and LSIs, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using material such as silicon. Step 4 (wafer process), which is referred to as a pre-treatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding) a packaging step (chip sealing), and the like. Step 6 (inspection) performs various tests for the semiconductor device made in Step 5, such as a validity test and a durability test. Through these steps, a semiconductor device is finished and shipped (step 7).

FIG. 15 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor deposition, and the like. Step 14 (ion implantation) implants ions into the wafer. Step 15 (resist process) applies a photosensitive material onto the wafer. Step 16 (exposure) uses the exposure apparatus 1 to expose a circuit pattern on the mask onto the wafer. Step 17 (development) develops the exposed wafer. Step 18 (etching) etches parts other than a developed resist image. Step 19 (resist stripping) removes unused resist after etching. These steps are repeated, and multilayer circuit patterns are formed on the wafer. According to the inventive device fabrication method, the exposure apparatus 1 may manufacture high quality devices with good yield. Thus, a device fabrication method that uses the inventive lithography, and devices as resultant products also constitute one aspect according to the present invention.

Further, the present invention is not limited to these preferred embodiments and various variations and modifications may be made without departing from the scope of the present invention.

The inventive exposure method and apparatus thus have such good resolution that may reduce the image quality degradation due to the residual aberration of the projection optical system, and form a desired pattern. Therefore, this exposure method and apparatus may provide high quality devices with good exposure performance.

What is claimed is:

1. An exposure method for projecting, through a projection optical system, a predetermined pattern formed on a mask onto an object to be exposed, said exposure method comprising the steps of:
    dividing an effective light source area for illuminating the mask into plural point light sources;
    calculating a Zernike sensitivity coefficient that represents sensitivity of a change of image quality of the predetermined pattern to a change of a Zernike coefficient, when wave front aberration in the projection optical system is developed into a Zernike polynomial for all divided point light sources;
    determining an effective light source distribution based on a combination of Zernike sensitivity coefficient of all the divided point light sources; and
    forming the effective light source distribution by intensity of each point light source.

2. An exposure method according to claim 1, wherein said calculating step repeats for a combination of all the plural point light sources and the Zernike coefficient.

3. An exposure method according to claim 1, wherein said determining step determines the effective light source using a combination of the point light sources while changing intensity of the point light sources and maintaining image quality of the predetermined pattern.

4. An exposure method according to claim 1, wherein the wave front aberration includes residual aberration in the projection optical system.

5. An exposure apparatus comprising:
    a projection optical system for projecting a predetermined pattern formed on a mask onto an object to be exposed;
    an illumination optical system for varying an effective light source distribution for illuminating the mask; and
    a controller for forming the effective light source shape based on a combination of a Zernike sensitivity coefficient that represents sensitivity of a change of image quality of the predetermined pattern to a change of a Zernike coefficient, when wave front aberration in the projection optical system is developed into a Zernike polynomial for plural point light sources that divide an effective light source area for illuminating the mask by intensity of each point light source.

6. A database suitable for an exposure method for projecting, through a projection optical system, a predetermined pattern formed on a mask onto an object to be exposed, said database indicating a combination of a Zernike sensitivity coefficient that represents sensitivity of a change of image quality of the predetermined pattern to a change of a Zernike coefficient, when wave front aberration in the projection optical system is developed into a Zernike polynomial for plural point light sources that divide an effective light source area for illuminating the mask by intensity of each point light source.

7. A program that enables a computer to execute an exposure method for projecting, through a projection optical system, a predetermined pattern formed on a mask onto an object to be exposed,
    wherein said exposure method includes the steps of:
    dividing an effective light source area for illuminating the mask into plural point light sources;
    calculating a Zernike sensitivity coefficient that represents sensitivity of a change of image quality of the predetermined pattern to a change of a Zernike coefficient, when wave front aberration in the projection optical system is developed into a Zernike polynomial for all divided point light sources;
    determining an effective light source distribution based on a combination of Zernike sensitivity coefficient of all divided point light sources; and
    forming the effective light source distribution by intensity of each point light source.

8. A device fabrication method comprising the steps of:
    exposing an object using an exposure apparatus; and
    performing a predetermined process for the object exposed, wherein the exposure apparatus includes:
        (i) a projection optical system for projecting a predetermined pattern formed on a mask onto an object to be exposed;
        (ii) an illumination optical system for varying an effective light source distribution for illuminating the mask; and
        (iii) a controller for forming the effective light source shape based on a combination of a Zernike sensitivity coefficient that represents sensitivity of a change of image quality of the predetermined pattern to a change of a Zernike coefficient, when wave front aberration in the projection optical system is developed into a Zernike polynomial for plural point light sources that divide an effective light source area for illuminating the mask by intensity of each point light source.

* * * * *

UNITED STATES PATENT AND TRADEMARK OFFICE
CERTIFICATE OF CORRECTION

PATENT NO. : 7,095,481 B2
APPLICATION NO. : 10/660681
DATED : August 22, 2006
INVENTOR(S) : Hiroshi Morohoshi It is certified that error appears in the above-identified patent and that said Letters Patent is hereby corrected as shown below:

ON TITLE PAGE
    In item "(75) Inventor:," Hiroshi Morohoshi, Utsunomiya (JP)" should read -- Hiroshi Morohoshi, Tochigi (JP) --.
    In item "(56) References Cited," under "U.S. PATENT DOCUMENTS," in the second column, the second-listed entry "6,787,789 B1 * 9/2004 Van Der Laan..................250/548" should read -- 6,787,789 B2 * 9/2004 Van Der Laan..................250/548 --.
    In item "(56) References Cited," under "U.S. PATENT DOCUMENTS," in the second column, the third-listed entry "6,809,797 B1 * 10/2004 Baselmans et al. ..................355/52" should read -- 6,809,797 B2 * 10/2004 Baselmans et al. ..................355/52 --.

IN THE DRAWINGS:
    Sheet 18 of 20, "FIG. 18," in the legend underneath the graph (*i.e.*, the abscissa), "Coef," should read
-- Coef. --.
    Sheet 20 of 20, "FIG. 20," in the legend underneath the graph (*i.e.*, the abscissa), "Coef," should read
-- Coef. --.

COLUMN 2:
    Line 65, the first occurrence of "may" should be deleted.

COLUMN 3:
    Line 6, the first occurrence of "of" should be deleted.

COLUMN 5:
    Line 40, " $x' = \Sigma a_{jk}(P_{ij}) \times b_{ij} \times f(C_k')$ " should read -- $x' = \Sigma a_{ijk}(P_{ij}) \times b_{ij} \times f(C_k')$ --.

Line 51, "distribution Ilo," should read -- distribution ILo, --.

Line 55, " $ILo = \Sigma b_{ij}' \times P_{ij}$ " should read -- $ILo = \Sigma b_{ij}' \times P_{ij}$ --.

Line 58, distribution "Ilo," should read -- distribution ILo, --.

COLUMN 6:
    Line 21, "a" should read -- as --.

UNITED STATES PATENT AND TRADEMARK OFFICE
CERTIFICATE OF CORRECTION

PATENT NO.        : 7,095,481 B2
APPLICATION NO. : 10/660681
DATED             : August 22, 2006
INVENTOR(S)       : Hiroshi Morohoshi It is certified that error appears in the above-identified patent and that said Letters Patent is hereby corrected as shown below:

COLUMN 7:
    Line 66, "of" should read -- is --.

COLUMN 9:
    Line 7, "$vd = a_v \times (C_{11})^2 + v0$" should read -- $vd = a_v \times (C_{11})^2 + v0$. --.
    Line 9, "Zernikie" should read -- Zernike --.

COLUMN 10:
    Line 7, "reduces" should read -- is reduced --.
    Line 28, "reduces" should read -- is reduced --.
    Line 62, "express $b_{iij}$" should read -- express $b_{ij}$ --.

COLUMN 11:
    In "TABLE 3," under column "$C_1$," the last-listed entry, "$a_{1284,1}$" should read -- $a_{1184,1}$ --.
    Line 34, "sensitivity" should read -- sensitivities --.

COLUMN 13:
    Line 17, "correspond" should read -- corresponds --.
    Line 21, "directs" should read -- is directed --.
    Line 24, "directs" should read -- is directed --.
    Line 60, "directs" should read -- is directed --.

COLUMN 14:
    Line 4, "reduce" should read -- be reduced -- and "the DMD" should read -- the DMDs --.

Signed and Sealed this

Tenth Day of April, 2007

JON W. DUDAS
*Director of the United States Patent and Trademark Office*